US011098414B2

(12) United States Patent
Mitsuya et al.

(10) Patent No.: US 11,098,414 B2
(45) Date of Patent: Aug. 24, 2021

(54) PLATING SYSTEM, A PLATING SYSTEM CONTROL METHOD, AND A STORAGE MEDIUM CONTAINING A PROGRAM FOR CAUSING A COMPUTER TO EXECUTE THE PLATING SYSTEM CONTROL METHOD

(71) Applicant: EBARA CORPORATION, Tokyo (JP)

(72) Inventors: Takashi Mitsuya, Tokyo (JP); Ryuya Koizumi, Tokyo (JP); Toshio Yokoyama, Tokyo (JP); Masashi Shimoyama, Tokyo (JP); Kunio Oishi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 126 days.

(21) Appl. No.: 16/664,599

(22) Filed: Oct. 25, 2019

(65) Prior Publication Data

US 2020/0056301 A1    Feb. 20, 2020

Related U.S. Application Data

(62) Division of application No. 15/669,735, filed on Aug. 4, 2017, now Pat. No. 10,501,862.

(30) Foreign Application Priority Data

Aug. 8, 2016    (JP) ................. 2016-155710

(51) Int. Cl.
*C25D 17/00* (2006.01)
*H01L 21/67* (2006.01)
(Continued)

(52) U.S. Cl.
CPC ........... *C25D 17/001* (2013.01); *C25D 21/12* (2013.01); *H01L 21/6723* (2013.01); *H01L 21/67253* (2013.01); *H01L 21/76879* (2013.01); *H01L 22/00* (2013.01); *H01L 24/11* (2013.01); *C25D 17/004* (2013.01); *C25D 17/008* (2013.01); *C25D 17/06* (2013.01);
(Continued)

(58) Field of Classification Search
CPC ...................................................... C25D 21/12
See application file for complete search history.

(56) References Cited

U.S. PATENT DOCUMENTS

2002/0006876 A1    1/2002    Hongo et al.
2002/0056647 A1    5/2002    Mishima et al.
(Continued)

FOREIGN PATENT DOCUMENTS

JP    S63-247400 A    10/1988
JP    H02-298297 A    12/1990
(Continued)

*Primary Examiner* — Nicholas A Smith
(74) *Attorney, Agent, or Firm* — BakerHostetler

(57) ABSTRACT

A plating system comprising a plating tank for applying plate processing to a substrate, a sensor configured to measure actual plating film thickness of the substrate, and a controller configured to control plating current supplied to the plating tank and plating time for the plate processing of the substrate within the plating tank. The controller is capable of setting target plating film thickness, plating current, and plating time as a plate processing recipe. At least one of the plating current and the plating time is automatically corrected so that the actual plating film thickness and the target plating film thickness become equal to each other, and the result is reflected in the plate processing for the subsequent substrate.

12 Claims, 17 Drawing Sheets

(51) Int. Cl.
  *H01L 21/66* (2006.01)
  *C25D 21/12* (2006.01)
  *H01L 21/768* (2006.01)
  *H01L 23/00* (2006.01)
  *C25D 17/06* (2006.01)
  *H01L 21/288* (2006.01)
(52) U.S. Cl.
  CPC .... *H01L 21/2885* (2013.01); *H01L 21/76885* (2013.01); *H01L 21/76898* (2013.01); *H01L 22/26* (2013.01); *H01L 2224/117* (2013.01); *H01L 2224/11462* (2013.01)

(56) References Cited

U.S. PATENT DOCUMENTS

| | | |
|---|---|---|
| 2002/0063097 A1 | 5/2002 | Fukunaga et al. |
| 2002/0070126 A1 | 6/2002 | Sato et al. |
| 2003/0000840 A1 | 1/2003 | Kimura et al. |
| 2005/0218003 A1 | 10/2005 | Wang et al. |
| 2006/0086616 A1 | 4/2006 | Kurashina et al. |
| 2006/0141157 A1 | 6/2006 | Sekimoto et al. |
| 2007/0103150 A1 | 5/2007 | Tada et al. |
| 2009/0000950 A1 | 1/2009 | Ortleb et al. |

FOREIGN PATENT DOCUMENTS

| | | |
|---|---|---|
| JP | 2002-093761 A | 3/2002 |
| JP | 2002-105695 A | 4/2002 |
| JP | 2003-013297 A | 1/2003 |
| JP | 2003-183892 A | 7/2003 |
| JP | 2003-321792 A | 11/2003 |
| JP | 2005-121616 A | 5/2005 |
| JP | 2005-240108 A | 9/2005 |
| JP | 2006-319348 A | 11/2006 |
| JP | 2008-013851 A | 1/2008 |
| JP | 2011-064590 A | 3/2011 |

PLATING SYSTEM, A PLATING SYSTEM CONTROL METHOD, AND A STORAGE MEDIUM CONTAINING A PROGRAM FOR CAUSING A COMPUTER TO EXECUTE THE PLATING SYSTEM CONTROL METHOD

FIELD OF THE INVENTION

The invention relates to a plating system configured to plate a to-be-plated object (substrate) such as a semiconductor wafer, a plating system control method, and a storage medium containing a program for causing a computer to execute the plating system control method.

RELATED ART

Conventionally, wiring has been installed in minute wiring grooves, holes or resist openings formed in semiconductor wafer surfaces and the like. Also, bumps (bump electrodes) which are electrically connected to electrodes in a package have been formed in semiconductor wafer surfaces. Known methods for forming such wiring and bumps include electrolytic plating methods, vapor-deposition methods, printing methods, ball bump methods, etc. In recent years, as the number of I/O in semiconductor chips is increased, and pitches in semiconductor chips are narrowed, the electrolytic plating methods have been more and more widely used because the methods allow miniaturization and are relatively stable in performance.

In plate processing for rewiring or bump formation, the plate processing is carried out after parameters including a plating current value, plating time, and the like are set by the user as recipe setting for the plate processing according to the target plating film thickness and actual plating area of substrates to be processed. In the same processes, the plate processing is carried out on the same process conditions (recipe). In the case where plating film thickness is measured after the plate processing, it is generally required that a whole carrier containing wafers be transferred from a plating system to a separate film thickness measurement device after all the wafers in the same carrier undergo the plate processing, and thereafter, the film thickness and a profile within a wafer plane be individually measured.

As examples of the plating system, there are plating systems described in Japanese Unexamined Patent Application Publication No. 2002-105695 (Patent Document 1), Japanese Unexamined Patent Application Publication No. 2003-013297 (Patent Document 2), Japanese Unexamined Patent Application Publication No. 2003-183892 (Patent Document 3), Japanese Unexamined Patent Application Publication No. 2003-321792 (Patent Document 4), Japanese Unexamined Patent Application Publication No. 2005-121616 (Patent Document 5), Japanese Unexamined Patent Application Publication No. 2005-240108 (Patent Document 6), Japanese Unexamined Patent Application Publication No. 2008-013851 (Patent Document 7), Japanese Unexamined Patent Application Publication No. 2011-064590 (Patent Document 8), and Japanese Unexamined Patent Application Publication No. 2006-319348 (Patent Document 9).

SUMMARY OF THE INVENTION

Problems to be Solved

Japanese Unexamined Patent Application Publication No. 2002-105695 (Patent Document 1) discloses a plating system in which anode area is smaller than substrate area. The plating system forms a plating film and simultaneously measures plating film thickness of a substrate surface which does not correspond to the anode. The document merely makes a reference to film thickness measurement with respect to a part of the substrate surface which does not correspond to the anode.

Japanese Unexamined Patent Application Publication No. 2003-013297 (Patent Document 2) discloses a plating system which detects an end point from a voltage change during a plating process. The document does not mention changing plating conditions in accordance with measurement results.

Japanese Unexamined Patent Application Publication No. 2003-183892 (Patent Document 3) discloses a plating system which measures plating film thickness, saves measurement results, and determines abnormalities. The document does not mention changing plating conditions in accordance with the measurement results.

Japanese Unexamined Patent Application Publication No. 2003-321792 (Patent Document 4) discloses a plating system which measures plating film thickness and simply reflects measurement results on bevel etching time. The document does not mention changing plating conditions.

Japanese Unexamined Patent Application Publication No. 2005-121616 (Patent Document 5) discloses a polishing apparatus which measures film thickness using an eddy current sensor. The document does not specify about changing plating conditions in accordance with measured film thickness.

Japanese Unexamined Patent Application Publication No. 2005-240108 (Patent Document 6) discloses a system including a film thickness measurement device for contact or non-contact measurement of plating film thickness. The document describes detecting abnormalities based on measurement results but does not mention changing plating conditions in accordance with the measurement results.

Japanese Unexamined Patent Application Publication No. 2008-013851 (Patent Document 7) describes that plating time and the like for achieving desired plating film thickness can be adjusted in accordance with the measurement of plating film thickness. However, the document does not explain exactly how to adjust the plating time.

Japanese Unexamined Patent Application Publication No. 2011-064590 (Patent Document 8) discloses a system in which an eddy current sensor is disposed in the inner wall surface of a plating tank. The document does not provide any specific description of changing plating conditions including plating current and the like.

Japanese Unexamined Patent Application Publication No. 2006-319348 (Patent Document 9) discloses an electroplating system configured to carry out electroplating while evenly dispersing process fluid over the entire wafer surface. The document does not mention measuring film thickness to change plating conditions in accordance with measurement results. Although the document teaches adjusting a current flow in accordance with the profile of metal thin film thickness, this relates to the polish processing of a polishing apparatus.

When a plating system is not provided with means for measuring plating film thickness, there is no means to directly check if target plating film thickness is achieved. Even if plating is carried out on the same process conditions, average plating film thickness in plane sometimes changes over time. When the target plating film thickness is not achieved, plate processing conditions need to be adjusted to achieve the target plating film thickness. However, since the plating system does not include any means for measuring plating film thickness, it is required to move the substrate to a separate measurement device and then check a result. This is time-consuming and deteriorates overall processing ability. Furthermore, it takes time to complete the measurement of plating film thickness and the adjustment of plate processing conditions, so that the plate processing occasionally has to be applied to several or more lots in an improper plating state. In this light, plating systems need to be configured so that plating conditions can be adjusted with proper timing.

Plating systems do not include any effective means for measuring film thickness or a film thickness profile (film thickness distribution) and, on the basis of results of the measurement, correcting process conditions to obtain target plating film thickness or profile. Plating systems thus need means for correcting the process conditions.

An object of the invention is to solve at least part of the above-mentioned problems.

Means for Solving the Problems

A plating system according to one aspect of the present invention comprises a plating tank for applying plate processing to a substrate, a sensor configured to measure actual plating film thickness of the substrate, and a controller configured to control plating current and plating time for the plate processing of the substrate within the plating tank. The controller is capable of setting target plating film thickness, plating current, and plating time as a plate processing recipe. In accordance with the actual plating film thickness and the target plating film thickness, at least one of the plating current and the plating time is automatically corrected so that the actual plating film thickness and the target plating film thickness become equal to each other, and at least one of the corrected plating current and the corrected plating time is reflected in the plate processing for the subsequent substrate.

A method for controlling a plating system according to one aspect of the invention, the plating system comprising a plating tank for applying plate processing to a substrate, a sensor configured to measure actual plating film thickness of the substrate, and a controller configured to control plating current and plating time for the plate processing of the substrate within the plating tank. The method includes the step in which target plating film thickness, plating current, and plating time are set as a plate processing recipe. The method further includes the step in which in accordance with the actual plating film thickness and the target plating film thickness, at least one of the plating current and the plating time is automatically corrected so that the actual plating film thickness and the target plating film thickness become equal to each other, and at least one of the corrected plating current and the corrected plating time is reflected in the plate processing for the subsequent substrate.

A storage medium according to one aspect of the invention is a storage medium containing a program for causing a computer to execute a method for controlling the plating system, the plating system comprising a plating tank for applying plate processing to a substrate, a sensor configured to measure actual plating film thickness of the substrate, and a controller configured to control plating current and plating time for the plate processing of the substrate within the plating tank. The program executes the steps of: setting target plating film thickness, plating current, and plating time as a plate processing recipe; and automatically correcting at least one of the plating current and the plating time in accordance with the actual plating film thickness and the target plating film thickness so that the actual plating film thickness and the target plating film thickness become equal to each other, and reflecting at least one of the corrected plating current and the corrected plating time in the plate processing for the subsequent substrate.

MODE FOR CARRYING OUT THE INVENTION

One embodiment relates to a plating system, a plating system control method, and a storage medium containing a program for causing a computer to execute the plating system control method, which are suitable for forming a plating film in minute wiring grooves, holes or resist openings formed in semiconductor wafer surfaces and also forming bumps (bump electrodes) in semiconductor wafer surfaces, the bumps being electrically connected to electrodes in a package.

The plating system, the plating system control method, and the storage medium containing a program for causing a computer to execute the plating system control method according to the one embodiment, for example, can be used for plugging via holes at the time of manufacturing interposers or spacers used for so-called three-dimensional mounting of semiconductor chips or the like, the interposers or spacers including a large number of via plugs vertically extending through a substrate. More specifically, the plating system, the plating system control method, and the storage medium containing a program for causing a computer to execute the plating system control method according to the invention can be used for attaching the substrate to a holder and immersing the holder into a plating tank to perform plating.

Embodiments of the invention will be described below with reference to the attached drawings. In each of the following embodiments, similar or corresponding members will be provided with the same reference marks, and explanations thereof will be omitted.

Figure 1:
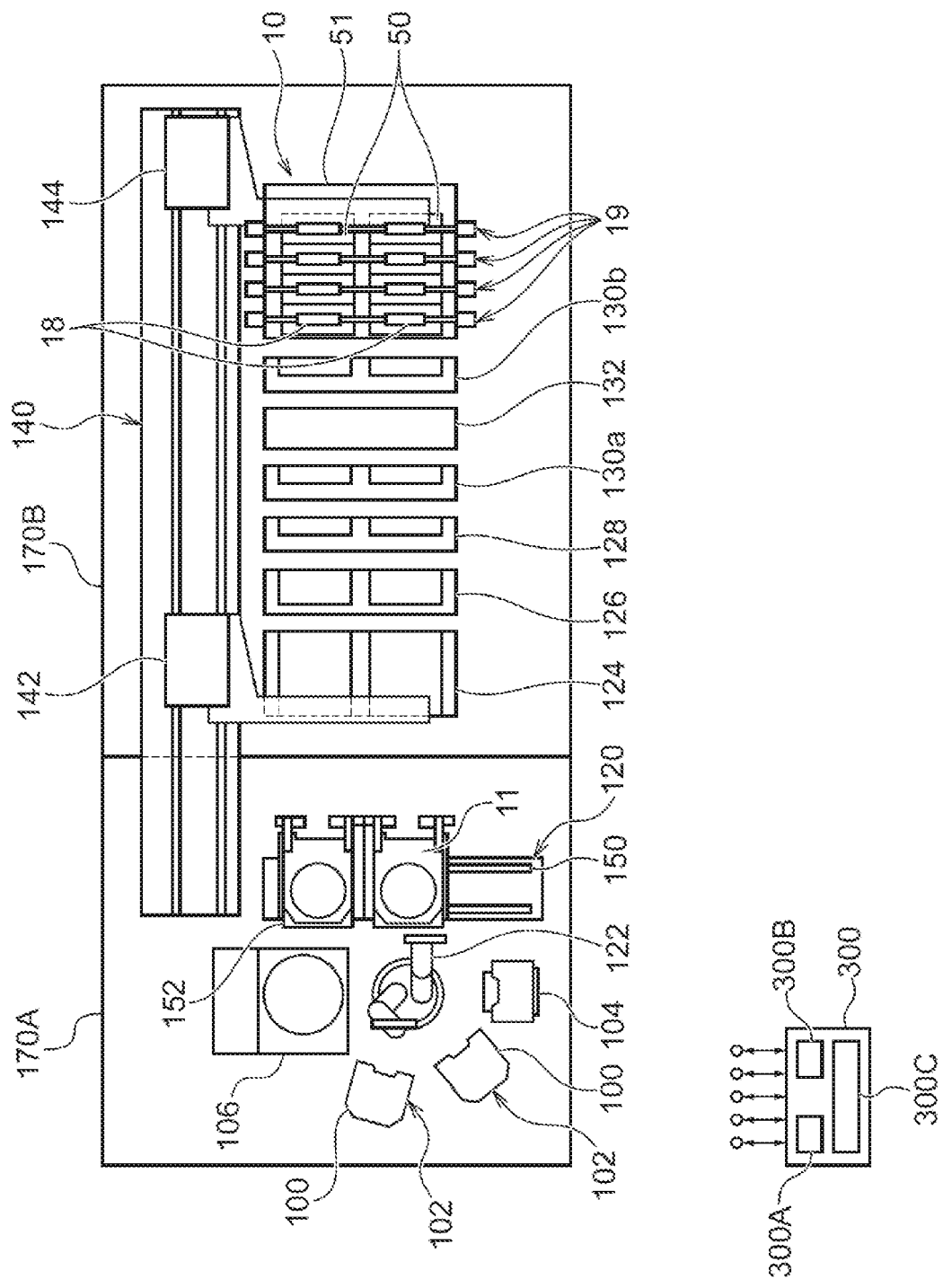
FIG. 1 is an overall layout view of a plating system according to one embodiment of the invention.

FIG. 1 is an overall layout view of a plating system according to one embodiment of the invention. As shown in FIG. 1, a plating system 1 includes a load/unload unit 170A for loading or unloading a substrate W (see FIG. 4) that is a to-be-plated object, such as a semiconductor wafer, onto or from a substrate holder 11. The plating system 1 further includes a plate processing unit 170B for processing the substrate W.

The load/unload unit 170A includes two cassette tables 102, an aligner 104 configured to align an orientation flat or a notch of the substrate W with predetermined directions, and a spin rinse dryer 106 configured to dry the plated substrate W by spinning the substrate W at a high velocity. Installed in each of the cassette tables 102 is a cassette 100 that contains the substrate W such as a semiconductor wafer or the like. The cassette 100 is also called a carrier, which is, for example, a FOUP (Front-Opening Unified Pod). In the vicinity of the spin rinse dryer (SRD) 106, there is disposed a substrate attachment/detachment section (fixing station) 120 in which the substrate holder 11 is placed for attachment/detachment of the substrate W. The above-mentioned units, namely, the cassette tables 102, the aligner 104, the spin rinse dryer 106, and the substrate attachment/detachment section 120 surround a substrate transfer device 122 which comprises a transfer robot configured to transfer the substrate W between the above-mentioned units.

The substrate attachment/detachment section 120 includes a flat plate-like placement plate 152 that is horizontally slidable along a rail 150. The two substrate holders 11 are horizontally aligned on the placement plate 152. After the transfer of the substrate W is done between one of the substrate holders 11 and the substrate transfer device 122, the placement plate 152 is slid in the horizontal direction, and the transfer of the substrate W between the other substrate holder 11 and the substrate transfer device 122 takes place. This configuration of the load/unload unit 170A of the plating system is one example. The configuration of the load/unload unit 170A of the plating system 1 is not limited, and the load/unload unit 170A may be configured in another way.

The processing unit 170B of the plating system 1 includes a stocker 124, a prewet tank 126, a presoak tank 128, a first washing tank 130a, a blow tank 132, a second washing tank 130b, and a plating tank 10. In the stocker (also referred to as a stocker container installation section) 124, the substrate holders 11 are stored and temporarily placed. In the prewet tank 126, the substrate W is immersed in pure water or chemical. In the presoak tank 128, an oxidized film on a surface of a conductive layer, such as a seed layer, which is formed on a surface of the substrate W is removed by etching. In the first washing tank 130a, the substrate W that has been presoaked is washed in washing liquid (pure water or the like) together with the substrate holder 11. In the blow tank 132, the liquid is drained off from the substrate W that has been washed. In the second washing tank 130b, the substrate W that has been plated is washed in washing liquid together with the substrate holder 11. The stocker 124, the prewet tank 126, the presoak tank 128, the first washing tank 130a, the blow tank 132, the second washing tank 130b, and the plating tank 10 are disposed in the order named. The configuration of the processing unit 170B of the plating system 1 is one example. The configuration of the processing unit 170B of the plating system 1 is not limited, and the processing unit 170B may be configured in another way.

The plating tank 10 includes, for example, a plurality of plating cells (units) 50 each provided with an overflow tank 51. Each of the plating cells 50 contains one substrate W inside. The substrate W is immersed in a plating liquid that is contained in the plating cell 50. Plate processing is thus applied to the surface of the substrate W with copper, gold, silver, solder, nickel plate or the like. The plating tank 10 includes an anode electrode, not shown. The substrate holder 11 is disposed opposite to the anode electrode. The substrate holder 11 is supplied with voltage from a cathode electrode, not shown.

There is no particular limitation on kinds of the plating liquid. Various plating liquids may be used depending on the intended use. For example, in the case of copper plating, the plating liquid is normally prepared to include an inhibitor acting to absorb onto a copper surface with chlorine serving as a mediator (surfactant or the like), a promotor acting to enhance the plating of depressed areas (organic sulfur compound or the like), and a smoothing agent for suppressing a precipitation promotion effect of the promotor and thus improving flatness of film thickness (quaternized amine or the like).

The plating liquid may be one containing CoWB (cobalt tungsten boron) or CoWP (cobalt tungsten phosphide) for forming a metal film on the surface of the substrate W having Cu wiring. In order to prevent Cu from spreading in an insulating film, it is possible to use a plating liquid for forming a barrier film to be disposed on the surface of the substrate W and surfaces of the depressed areas of the substrate W before the Cu wiring is formed. For example, a plating liquid containing CoWB and Ta (tantalum) may be used.

The plating system 1 includes a linear-motor substrate holder transfer device 140. The substrate holder transfer device 140 is located on a lateral side of the devices (the stocker 124, the prewet tank 126, the presoak tank 128, the first washing tank 130a, the blow tank 132, the second washing tank 130b, the plating tank 10, and the substrate attachment/detachment section 120). The substrate holder transfer device 140 transfers the substrate holder 11 and the substrate W together between the devices. The substrate holder transfer device 140 includes a first transporter 142 and a second transporter 144. The first transporter 142 is configured to transfer the substrate W between the substrate attachment/detachment section 120, the stocker 124, the preset tank 126, the presoak tank 128, the first washing tank 130a, and the blow tank 132. The second transporter 144 is configured to transfer the substrate W between the first washing tank 130a, the second washing tank 130b, the blow tank 132, and the plating tank 10. According to another embodiment, the plating system 1 may include either one of the first transporter 142 and the second transporter 144.

Each of the plating cells 50 includes a paddle 18 inside as a stirring rod for stirring the plating liquid in the plating cell 50. Paddle driving devices 19 for driving the paddles 18 are disposed on both sides of the overflow tank 51.

[Substrate Holder]

The substrate holder 11 holds the substrate W so as to seal end portions (edges, outer periphery) and a back side of the substrate W from the plating liquid and expose a to-be-plated surface during the plate processing of the substrate W. The substrate holder 11 may have a contact point (contact) which contacts a peripheral portion of the to-be-plated surface of the substrate W and feeds power from an external power source to the peripheral portion. The substrate holder 11 is stored in the stocker 124 prior to the plate processing. During the plate processing, the substrate holder 11 is transferred by the substrate holder transfer device 140 between the stocker 124 and the processing tanks of the plate processing unit 170B. After the plate processing, the substrate holder 11 is stored again in the stocker 124. In the plating system 1, the substrate W held by the substrate holder 11 is immersed in a vertical position in the plating liquid of the plating tank 10. Plating is then carried out while the plating liquid is being injected from a bottom of the plating tank 10 to be overflowed. The plating tank 10 preferably has a plurality of sections (plating cells 50). In each of the plating cells 50, one substrate holder 11 holding one substrate W is immersed in the plating liquid in the vertical position to be subjected to the plate processing. The plating cell 50 preferably includes an inserting portion into which the substrate W is inserted, a conducting portion which carries current to the substrate holder 11, an anode electrode, the paddle 18, and a shield. The anode electrode is used while being attached to an anode holder. The anode has an exposed surface that is opposed to the substrate W. The exposed surface is, for example, concentric with the substrate W. The substrate W held by the substrate holder 11 is subjected to the processing with process liquids in the processing tanks of the plate processing unit 170B.

With regard to layout of the processing tanks of the plate processing unit 170B, for example, if the plating system is of a type which uses two kinds of plaiting liquids, it is possible to arrange a prewashing tank (prewet tank), a preprocessing tank (presoak tank), a rinse tank (first washing tank), a first plating tank, a rinse tank (second washing tank), a second plating tank, a rinse tank (third washing tank), and the blow tank in the order named according to a process sequence. The plate processing unit 170B may be configured in another way. To eliminate an unnecessary transfer route, it is preferable that the processing tanks are arranged in an order of a process sequence. The kinds, number, and layout of the tanks in the plating system 1 may be freely decided according to the purpose of the processing to the substrates W.

The substrate holder transfer device 140 has an arm that suspends the substrate holder 11. The arm has a lifter, not shown, for holding the substrate holder 11 in the vertical position. The substrate holder transfer device 140 can be moved along a travel axis by a transfer mechanism, not shown, such as a linear motor, between the load/unload unit 170A, the processing tanks of the plate processing unit 170B, and the stocker 124. The substrate holder transfer device 140 holds and transfers the substrate holder 11 in the vertical position. The stocker 124 is a stocker that stores the substrate holder 11. The stocker 124 is capable of storing a plurality of substrate holders 11 in the vertical position.

[Configuration of the Substrate Holder]

Figure 2:
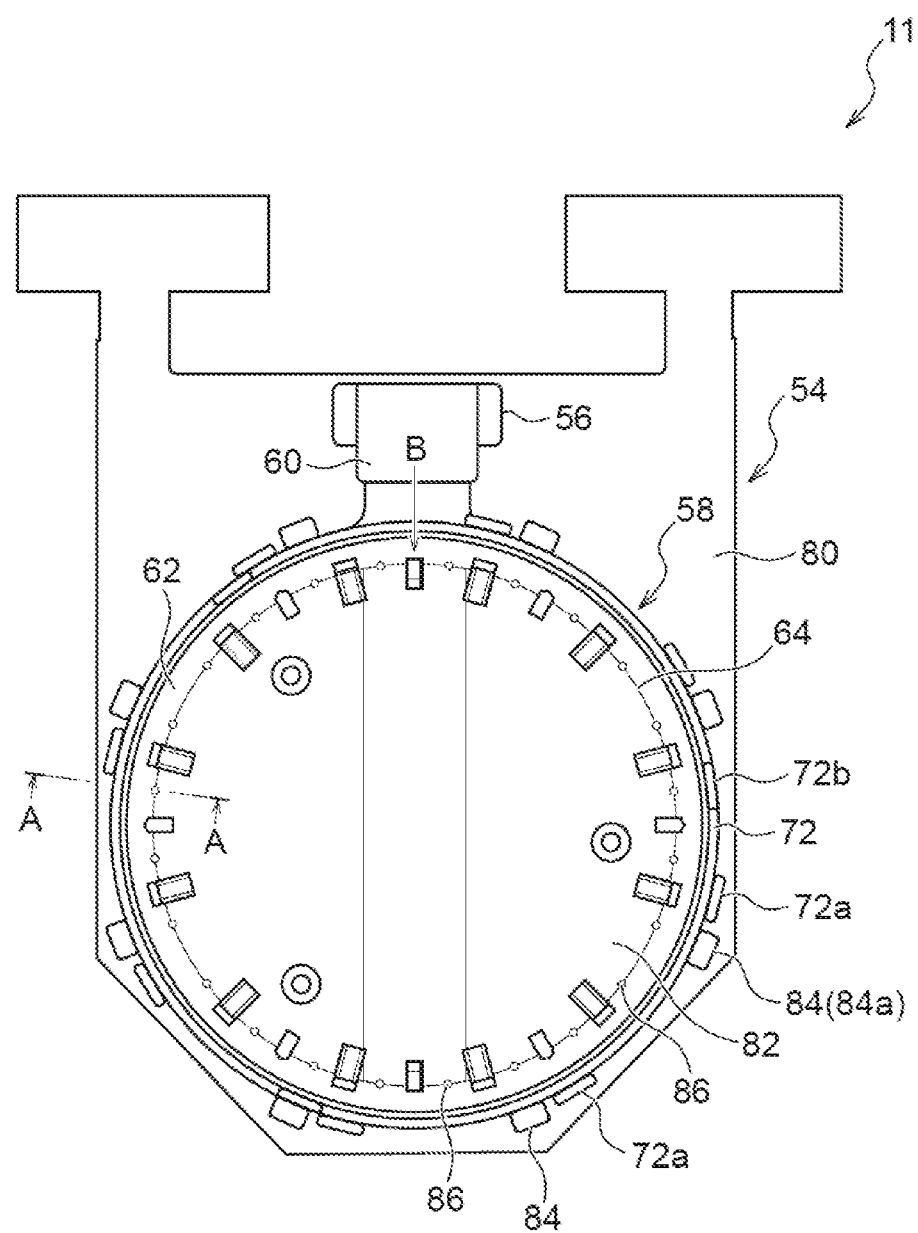
FIG. 2 is a plan view of a substrate holder 11 shown in FIG. 1.
Figure 3:
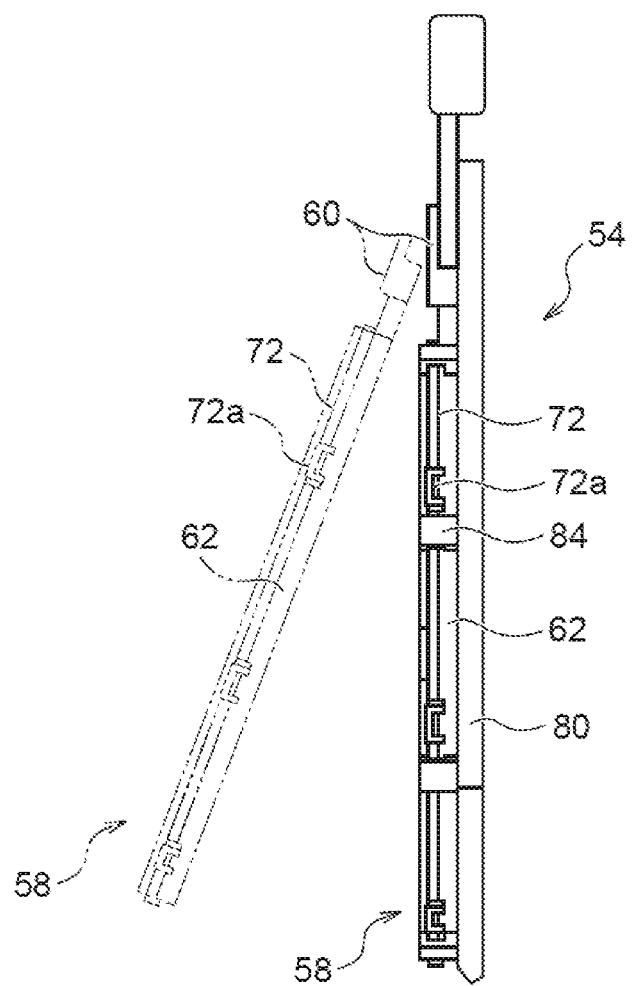
FIG. 3 is a right-side lateral view of the substrate holder 11 shown in FIG. 1.
Figure 4:
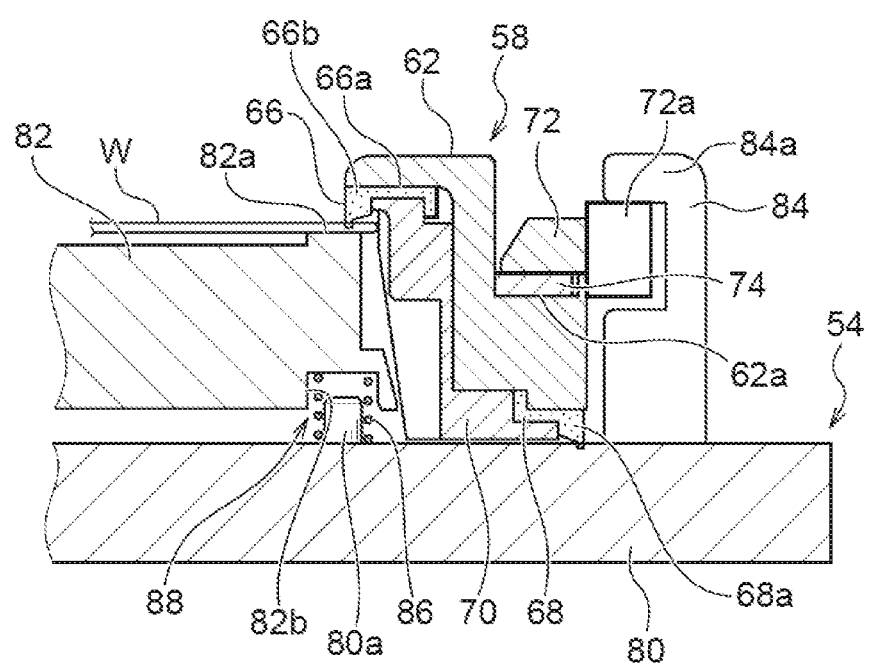
FIG. 4 is an enlarged cross-sectional view, taken along line A-A of FIG. 2.

FIG. 2 is a plan view of the substrate holder 11 shown in FIG. 1. FIG. 3 is a right-side lateral view of the substrate holder 11 shown in FIG. 1. FIG. 4 is an enlarged cross-sectional view, taken along line A-A of FIG. 2. As shown in FIGS. 2 to 4, the substrate holder 11 includes a first holding member (fixed holding member) 54 that is, for example, made of vinyl chloride and formed in a rectangular flat plate-like shape, and a second holding member (movable holding member) 58 that is attached to the first holding member 54 to be openable/closable using a hinge 56. FIGS. 2 to 4 illustrate the example in which the second holding member 58 is configured to be openable/closable using the hinge 56. However, for example, the second holding member 58 may be disposed to an opposite position to the first holding member 54 and moved toward the first holding member 54 to be opened/closed. The second holding member 58 has a base 60 and a ring-like seal ring holder 62 that are made of, for example, vinyl chloride to facilitate a sliding motion of an after-mentioned ferrule 72 against the ring-like seal ring holder 62. A substrate seal member 66 is attached to a surface of the seal ring holder 62, which is opposed to the first holding member 54, so as to protrude inwards. The substrate seal member 66 comes into pressure contact with an outer peripheral portion of the substrate W along a substrate seal line 64 of the outer peripheral portion of the substrate W to seal the outer peripheral portion when the substrate W is held by the substrate holder 11. A holder seal member 68 is attached to a surface of the seal ring holder 62, which is opposed to the first holding member 54. The holder seal member 68 comes into pressure contact with an after-mentioned supporting base 80 of the first holding member 54 at a position more exterior than the substrate seal member 66 to seal the supporting base 80. When the substrate W is held by the substrate holder 11, the to-be-plated surface of the substrate W is exposed from an opening of the ring-like seal ring holder 62.

The substrate seal member 66 and the holder seal member 68 are attached to the seal ring holder 62 so as to be clamped between the seal ring holder 62 and a fixed ring 70 that is fastened to the seal ring holder 62 by a fastening tool such as a bolt. In a contact face (upper surface) of the substrate seal member 66, which is in contact with the seal ring holder 62, there is disposed a projecting part 66a that seals a gap between the substrate seal member 66 and the seal ring holder 62.

A stepped portion 62a is provided in an outer peripheral portion of the seal ring holder 62 of the second holding member 58. The ferrule 72 is rotatably mounted on the stepped portion 62a with a spacer 74 intervening therebetween. The ferrule 72 is mounted to be escape-proof by a holding plate, not shown, which is attached to a lateral face of the seal ring holder 62 to protrude outwards. The ferrule 72 is made of, for example, titanium which is excellent in corrosion resistance against acid and has sufficient rigidity. The spacer 74 is made of material, such as PTEF, which has a low friction coefficient, to facilitate the rotation of the ferrule 72.

The first holding member 54 includes the supporting base 80 that is formed in a substantially flat plate-like shape and comes into pressure contact with the holder seal member 68 to seal a gap between the holder seal member 68 and the second holding member 58 when the substrate W is held by the substrate holder 11, and a substantially disc-like movable base 82 that is separated from the supporting base 80. Clampers 84 are vertically arranged in the supporting base 80 of the first holding member 54 along a circumferential direction at regular intervals so as to be located in an outward position relative to the ferrule 72. The clampers 84 each has an inverted L-like shape and includes an inwardly protruding portion 84a that protrudes in an inward direction.

Projections 72a projecting outward are disposed in positions opposed to the clampers 84 so as to be located along a circumferential direction of the ferrule ring 72. Lower surfaces of the inwardly protruding portions 84a of the clampers 84 and upper surfaces of the projections 72a of the ferrules 72 are tapered surfaces which incline in opposite directions along a rotating direction. The ferrule 72 has raised portions, not shown, which are protruding upwards and arranged in a plurality places (for example, 44 places) of the ferrule 72 along the circumferential direction of the ferrule 72. The ferrule 72 can be rotated by rotating a rotating pin, not shown, to push the raised portions sideways.

As shown by dashed lines in FIG. 3, the substrate W is thus inserted in a center portion of the first holding member 54 with the second holding member 58 opened, and the second holding member 58 is then closed using the hinge 56. The ferrule 72 is rotated clockwise, which makes the projections 72a of the ferrule 72 slide into the inwardly protruding portions 84a of the clamper 84. In this manner, the first holding member 54 and the second holding member 58 are clamped and locked together through the tapered surfaces provided to the projections 72a of the ferrule 72 and the inwardly protruding portions 84a of the clamper 84, and at the same time, the substrate W is clamped by the substrate holder 11. The substrate W can be released from the substrate holder 11 by rotating the ferrule 72 anticlockwise to pull the projections 72a of the ferrule 72 out of the inwardly protruding portions 84a of the inverted L-shaped clamper 84.

The movable base 82 is disposed in the support base 80 with a thickness absorption mechanism 88 intervening therebetween so as to be movable in the vertical direction. The thickness absorption mechanism 88 includes a compression spring 86. The thickness absorption mechanism 88 further includes a protrusion 80a disposed in an upper surface of the support base 80, which is inserted in and engaged with a lower end of the compression spring 86, and a recess 82b disposed in a lower surface of the movable base 82, into which an upper end of the compression spring 86 is inserted. The compression spring 86 is designed to expand and contract in a straight vertical line because of the protrusion 80a and the recess 82b. The movable base 82 includes a ring-like support face 82a which has a shape and dimensions which correspond to the outer periphery of the substrate W and comes into contact with the outer periphery of the substrate W to support the substrate W when the substrate W is held by the substrate holder 11. The movable base 82 is attached to the support base 80 with the compression spring 86 intervening therebetween so as to be biased by the compression spring 86 in a direction moving away from the support base 80 and movable in a direction approaching the support base 80 against a biasing force (spring force) of the compression spring 86. When the substrate W of different thickness is held by the substrate holder 11, the movable base 82 moves in the direction approaching the support base 80 against the biasing force (spring force) of the compression spring 86 in accordance with the thickness of the substrate W. The thickness absorption mechanism 88 thus absorbs the thickness of the substrate W.

As described above, when the substrate W is held by the substrate holder 11 with the second holding member 58 locked to the first holding member 54, lower ends of downwardly protruding portions 66b located on an inner circumferential surface side (diametrically inner side) of the substrate seal member 66 come into pressure contact with the outer periphery of the substrate W held by the substrate holder 11 at positions along the substrate seal line 64. The holder seal member 68 is so configured that a lower end of a downwardly protruding portion 68a disposed on an outer periphery side (diametrically outer side) of the holder seal member 68 comes into pressure contact with the surface of the support base 80 of the first holding member 54 and evenly presses the seal members 66 and 68, accomplishing the sealing thereof. At this time, the movable base 82 moves so that an moving amount relative to the support base 80 varies correspondingly to changes in thickness of the substrates W. In other words, the thicker the substrate W is, the larger the moving amount of the movable base 82 relative to the support base 80 is, and the closer the movable base 82 approaches the support base 80. The change in thickness of the substrates W is thus absorbed by the thickness absorption mechanism 88.

Figure 5:
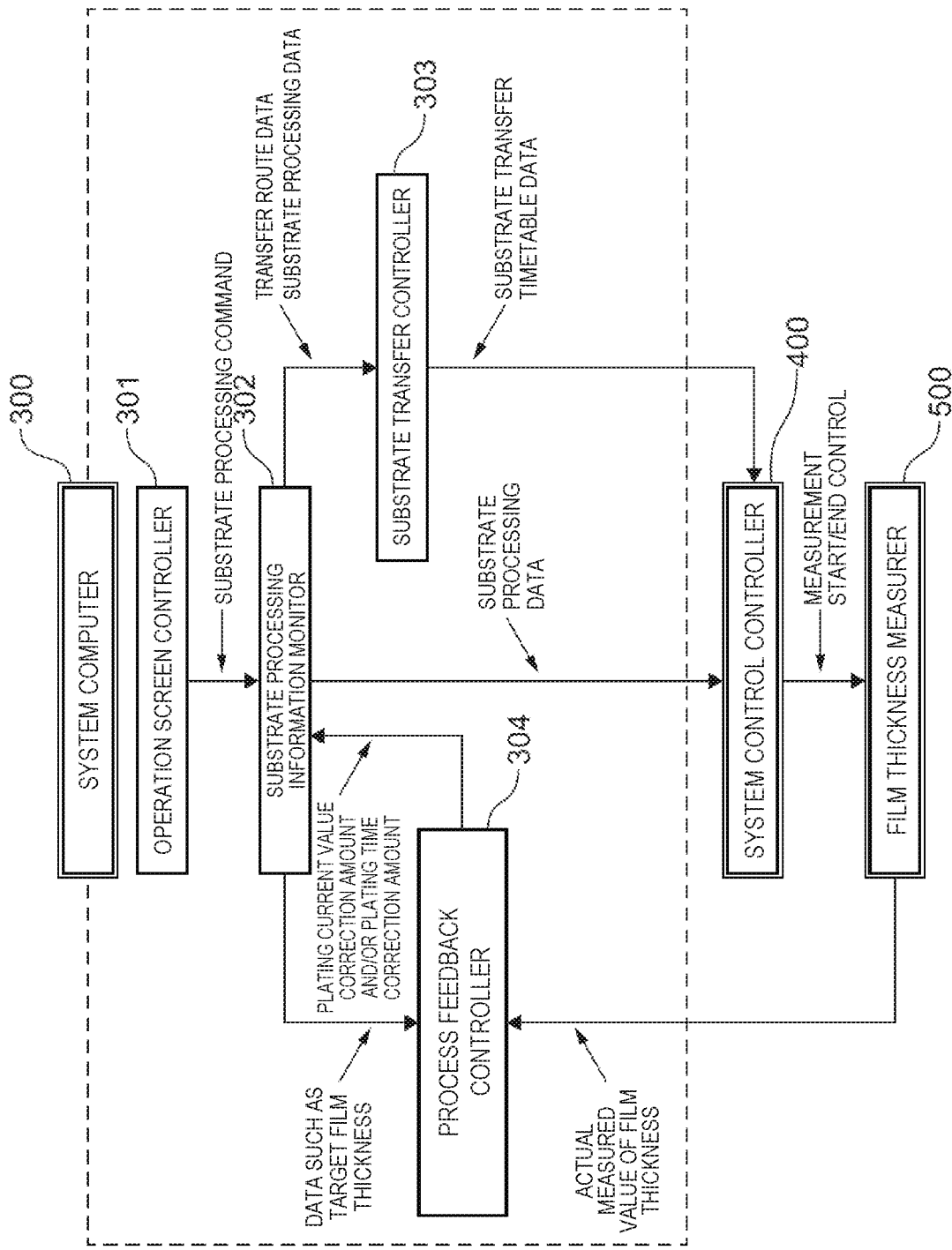
FIG. 5 is a block diagram showing a system computer and a system control controller, which control a plating system.

FIG. 5 is a block diagram showing a system computer 300 and a system control controller 400, which control the plating system 1. The plating system 1 configured as described above is controlled by the system computer 300 and the system controller 400.

As shown in FIG. 1, the system computer 300 includes a memory 300A containing a predetermined program, a CPU 300B that executes the program contained in the memory 300A, and a controller 300C that is actualized by the CPU 300B executing the program. As shown in FIG. 5, the controller 300C of the system computer 300 includes an operation screen controller 301, a substrate processing information monitor 302, a substrate transfer controller 303, and a process feedback controller 304. The controller 300C is capable of implementing transfer control of the substrate transfer device 122, transfer control of the substrate holder transfer device 140, control of the plating current and time in the plating tank 10, control of the opening of an anode mask, not shown, and opening diameter of a regulation plate, not shown, disposed in each of the plating cells 50, and the like. The storage medium which is a part of the memory 300A contains various setting data and various programs including after-mentioned processing programs (including correction processing of plating conditions). The storage medium which is a part of the memory 300A further contains a program for controlling a film thickness measurer 500 and performing the film thickness measurement. Storage media that can be used as the above-described storage medium may be publically-known storage media including memories such as ROMs and RAMs readable by computers, and disc-type storage medium such as hard discs, CD-ROMs, DVD-ROMs, and flexible discs.

The operation screen controller 301 controls a user interface including, for example, a display, a keyboard, a mouse, etc., and outputs a substrate processing command in accordance with input from the user interface. The substrate processing information monitor 302 receives the substrate processing command from the operation screen controller 301 and outputs substrate processing data and the substrate processing command to the system control controller 400. The substrate processing data is a recipe for plate processing and includes parameters of target plating film thickness, plating current, plating time, etc. The parameters of the plating current and time are calculated, for example, on the basis of the target plating film thickness, actual plating area or an aperture ratio. The substrate processing information monitor 302 outputs the substrate processing data such as the target plating film thickness to the process feedback controller 304 and receives at least one of the corrected plating current and the corrected plating time from the process feedback controller 304. The substrate processing information monitor 302 corrects the plating current and/or the plating time in accordance of the corrected plating current value and/or the corrected plating time value (which may be a correction amount of the plating current and/or plating time).

The substrate processing information monitor 302 outputs a transfer route data and the substrate processing data to the substrate transfer controller 303. The transfer route data and the substrate processing data are stored in a storage medium, not shown. Storage media that can be used as the above-described storage medium are publically-known storage media including memories such as ROMs and RAMs readable by computers, and disc-type storage medium such as hard discs, CD-ROMs, DVD-ROMs, and flexible discs.

The substrate transfer controller 303 implements the transfer control of the substrate transfer device 122 and the transfer control of the substrate holder transfer device 140. The substrate transfer controller 303 creates substrate transfer timetable data in accordance with the transfer route data and the substrate processing data and then outputs the data to the system control controller 400.

The system control controller 400, for example, comprises a PLC (programmable logic controller). The system control controller 400 receives the command and the data from the system computer 300 and controls each section of the plating system 1.

Figure 7:
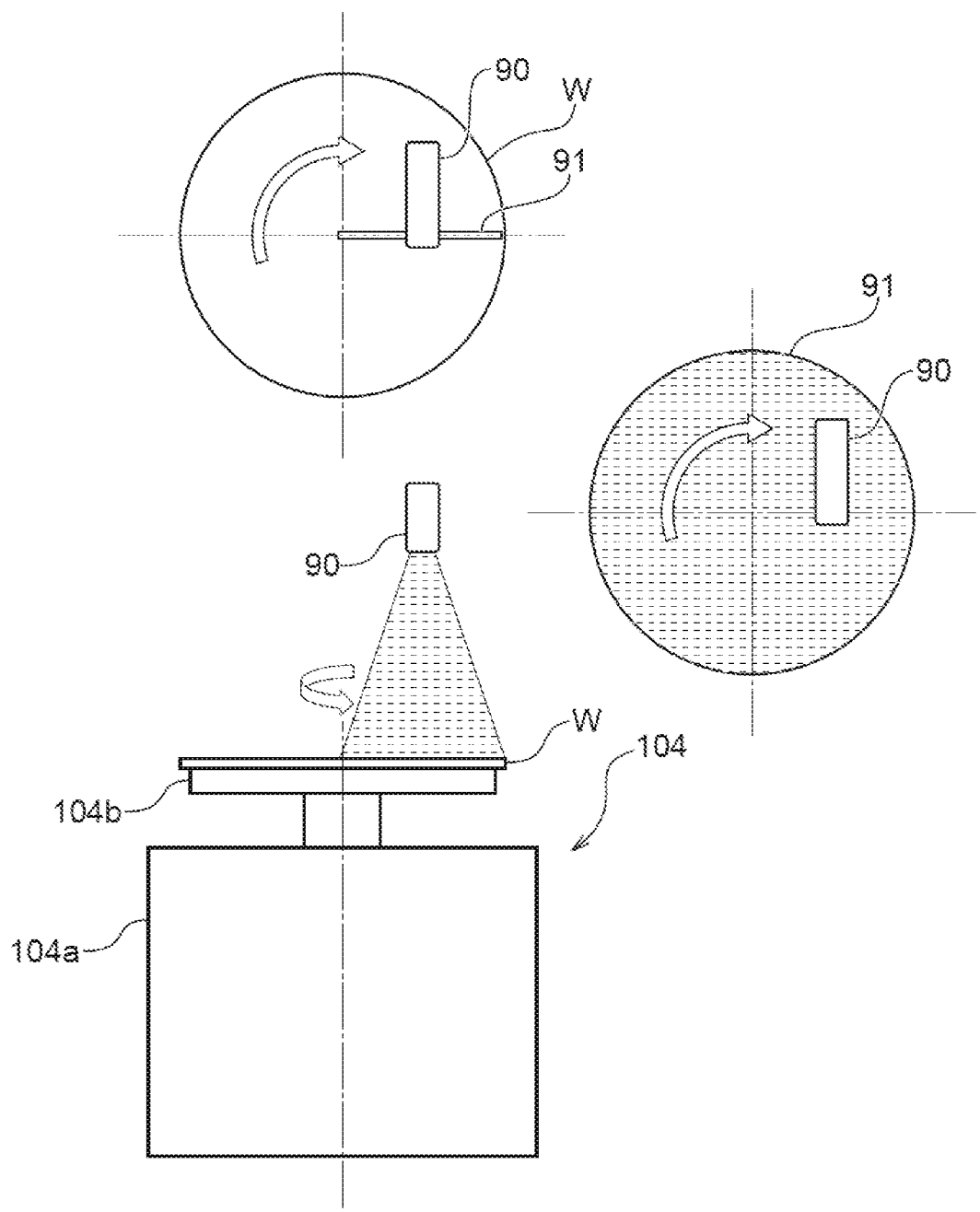
FIG. 7 is an explanatory view of measurement of the plating film thickness in an aligner.

According to the present embodiment, the plating system 1 includes the film thickness measurer 500. The film thickness measurer 500 is connected to the system control controller 400 and the system computer 300. The film thickness measurer 500 is controlled by the system computer 300 and the system control controller 400. The film thickness measurer 500 includes, for example, an after-mentioned displacement and length measurement sensor 90 (FIG. 7 and others). The film thickness measurer 500 receives a measurement start/end command from the system computer 300 and starts/ends the measurement of the plating film thickness, which is performed by the film thickness measurer 500. The film thickness measurer 500 outputs and feeds back an actual measured value of the plating film thickness to the process feedback controller 304 of the system computer 300.

(Method for Measuring the Plating Film Thickness)

A method for measuring the plating film thickness will be described below. The present embodiment uses, for example, the displacement and length measurement sensor 90 shown in FIG. 7 to measure the plating film thickness. The displacement and length measurement sensor 90 may be any one of sensors using laser beams, white lights, distance triangulation methods, confocal methods, etc. The displacement and length measurement sensor 90 is included in the film thickness measurer 500 shown in FIG. 5. Hereinafter, the displacement and length measurement sensor 90 will be referred to also simply as a length measurement sensor 90. The following description will refer to a situation in which an optical sensor is used to measure distance. However, it is possible to utilize a sensor using electromagnetic waves, ultrasonic waves, etc. The plating film thickness can be measured also by detecting eddy current.

(Method 1) An entire in-plane surface or partial in-plane surface of the substrate W is subjected to planar measurement and distance measurement and thus calculated as difference between preplating and post-plating average values of height of an entire measuring region. To be more specific, prior to the plate processing, for example, in the aligner 104 or the substrate attachment/detachment section 120, the entire in-plane surface or partial in-plane surface of the substrate W is subjected to planar measurement using the displacement and length measurement sensor 90, to thereby calculate the average value of height of the entire measuring region. After the plate processing, for example, in the aligner 104 or the substrate attachment/detachment section 120, the entire in-plane surface or partial in-plane surface of the substrate W is subjected to planar measurement using the displacement and length measurement sensor, to thereby calculate the average value of height of the entire measuring region. Subsequently, the difference between the average height value calculated before the plate processing and the average height value after the plate processing is calculated. The actual plating film thickness is then calculated from a difference value and the aperture ratio. This can be expressed by the following expression:

(Average value of actual plating film thickness)=
(Difference value of average height values)/
(Aperture ratio)

where the aperture ratio is a ratio of area of a portion to be actually plated to total area of the substrate W, which is exposed from the substrate holder 11. The above-described method enables the calculation of average film thickness of large area.

Figure 6:
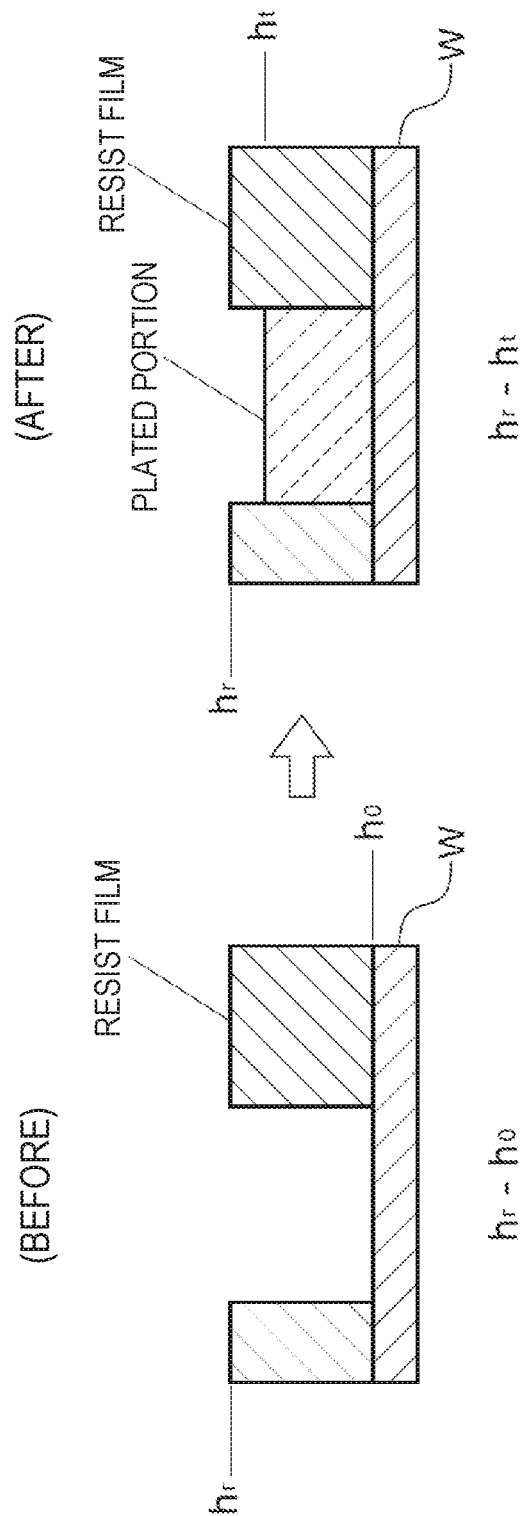
FIG. 6 is an explanatory view of a second method for measuring plating film thickness.

(Method 2) FIG. 6 is an explanatory view of a second method for measuring the plating film thickness. The second method calculates the plating film thickness from the difference between preplating and post-plating heights of a plating region. In FIG. 6, $h_o$ is reference height; $h_r$ is height of a resist; and $h_t$ is height of the plating region (hereinafter, referred to also as plating height). The reference height $h_o$ is height measured at the surface of the substrate W. According to the present method, the displacement and length measurement sensor 90 is used to measure difference between the resist height $h_r$ and the reference height $h_o$ prior to the plate processing. After the plate processing, difference between the resist height $h_r$ and the plating height $h_t$ ($h_r-h_t$) is measured. Difference between preplating and post-plating measured values is then obtained, to thereby calculate the plating film thickness. This can be expressed by (actual plating film thickness)=$(h_r-h_o)-(h_r-h_t)=h_t-h_o$. The present method enables accurate calculation of the plating film thickness even if distance between the substrate W and the displacement and length measurement sensor 90 changes in some degree during the plating. For reliable calculation of the difference between the resist and the plating region (wires and bump), and for judgment of a diametrical change in the plating film thickness, the displacement and length measurement sensor 90 or the substrate W may be moved in the diametrical and/or circumferential direction. Meanwhile, a plurality of height measurement values of the same kind (resist height, for example) may be averaged.

FIG. 7 is an explanatory view of measurement of the plating film thickness by an aligner. According to the present example, the length measurement sensor 90 is disposed on a stage 104*b* that is rotated by an aligner body 104*a*. First, the substrate W is placed on the stage 104*b*. After the measurement by the aligner 104 is begun, and the stage 104*b* is rotated, the measurement by the length measurement sensor 90 is begun. The length measurement sensor 90 emits a belt-shaped laser beam 91 onto the substrate W and receives reflected lights that are diffusely reflected on the surface of the substrate W to profile a shape of the surface of the substrate W (determine the height distribution). In the above-mentioned configuration, the profile of the surface shape of the substrate W is created by the length measurement sensor 90 at the time of alignment measurement by the aligner 104, which enables in-line measurement of the profile. Furthermore, since the substrate W is rotated by the aligner 104, it is possible to measure the profile of the entire surface of the substrate W.

Figure 8:
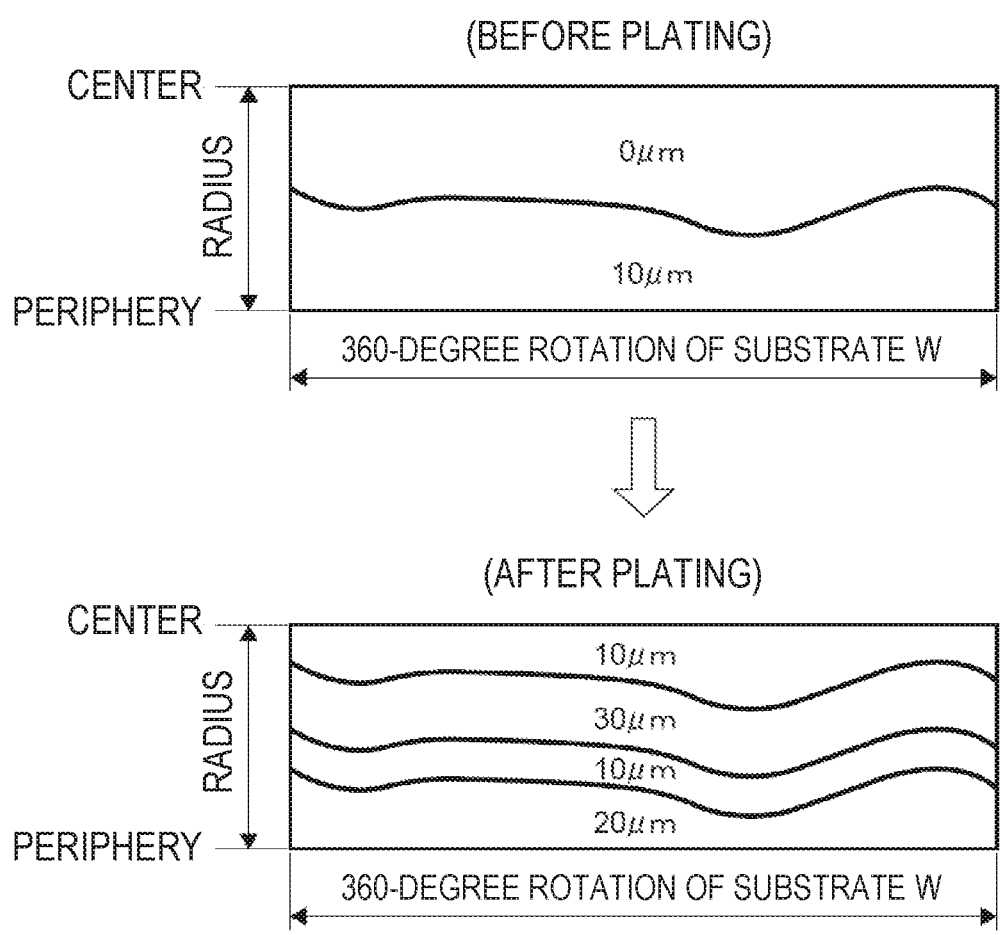
FIG. 8 is a graph showing a result of preplating film thickness measurement and a result of post-plating film thickness measurement in a case where the plating film thickness is measured by the aligner.

FIG. 8 is a graph showing a result of preplating film thickness measurement and a result of post-plating film thickness measurement in a case where the plating film thickness is measured by the aligner. A horizontal axis represents rotational positions in a 360-degree rotation of the substrate W, whereas the vertical axis represents radial positions. An upper side of the vertical axis is a center position of the substrate W, and a lower side of the vertical axis is the outer periphery side of the substrate W. With reference to an upper graph showing the result of the preplating film thickness measurement, the substrate W is not subjected to the plate processing, so that the measurement result shows that the height of the substrate W is 0 μm or 10 μm. Variation of 0 μm and 10 μm is attributable to warpage or non-flatness of the substrate W. In a lower graph showing the result of the post-plating film thickness measurement, measured values of the height of the plating region (film thickness) are 20 μm and 30 μm.

The example illustrated in FIG. 7 shows a case in which there is provided a single length measurement sensor. However, it is also possible to provide a plurality of length measurement sensors as in an after-mentioned example with reference to FIG. 10 so that the length measurement sensors are configured to measure respective divided regions. The specification discusses a case in which the entire surface of the substrate W is measured by the length measurement sensor. However, it is also possible to carry out the film thickness measurement of a partial region (for example, a fan-shaped region having a rotation angle of less than 360 degrees) by the length measurement sensor, and approximate the film thickness measurement result with respect to the partial region as a film thickness profile of the whole substrate W. It is also possible to carry out the film thickness measurement of a plurality of regions (for example, a plurality of fan-shaped regions each corresponding to a rotation angle of less than 360 degrees) by the length measurement sensor and approximate an average value of the film thickness measurement results with respect to the plurality of regions as a film thickness profile of the whole substrate W.

Figure 9:
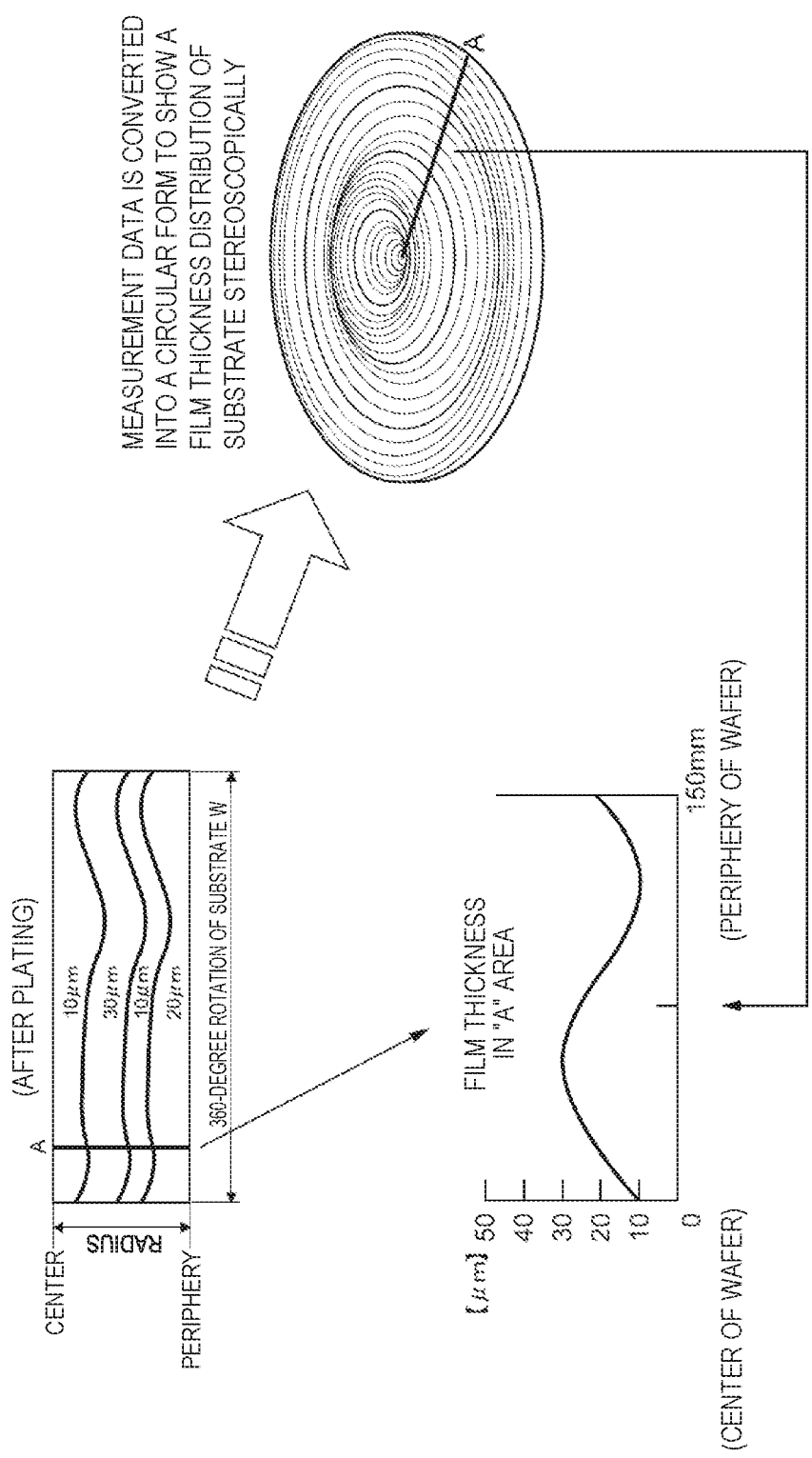
FIG. 9 is an explanatory view showing a film thickness measurement result after the plate processing.

FIG. 9 is an explanatory view showing a result of post-plating film thickness measurement. An upper left graph of FIG. 9 is similar to the lower graph of FIG. 8 and shows the result of the post-plating film thickness measurement. However, the graph of FIG. 9 includes a rotational position A of a specific rotation angle, which extends parallel to the vertical axis. A solid diagram on the right-hand side of FIG. 9 shows data in the upper left graph, which is converted into a circular form to show a film thickness distribution (profile) of the substrate W stereoscopically. The solid diagram shows that the surface shape (height) changes according to the measurement values shown in the upper left graph of FIG. 9 along a radial line corresponding to the rotational position A. A lower left graph of FIG. 9 shows the data at the rotational position A in the upper left graph of FIG. 9 in the form of relationship of a radial direction (horizontal axis) and the film thickness (vertical line). The lower left graph of FIG. 9 corresponds to the data at the rotational position A on the solid diagram on the right-hand side and therefore can be created also from the data of the solid diagram.

Figure 10:
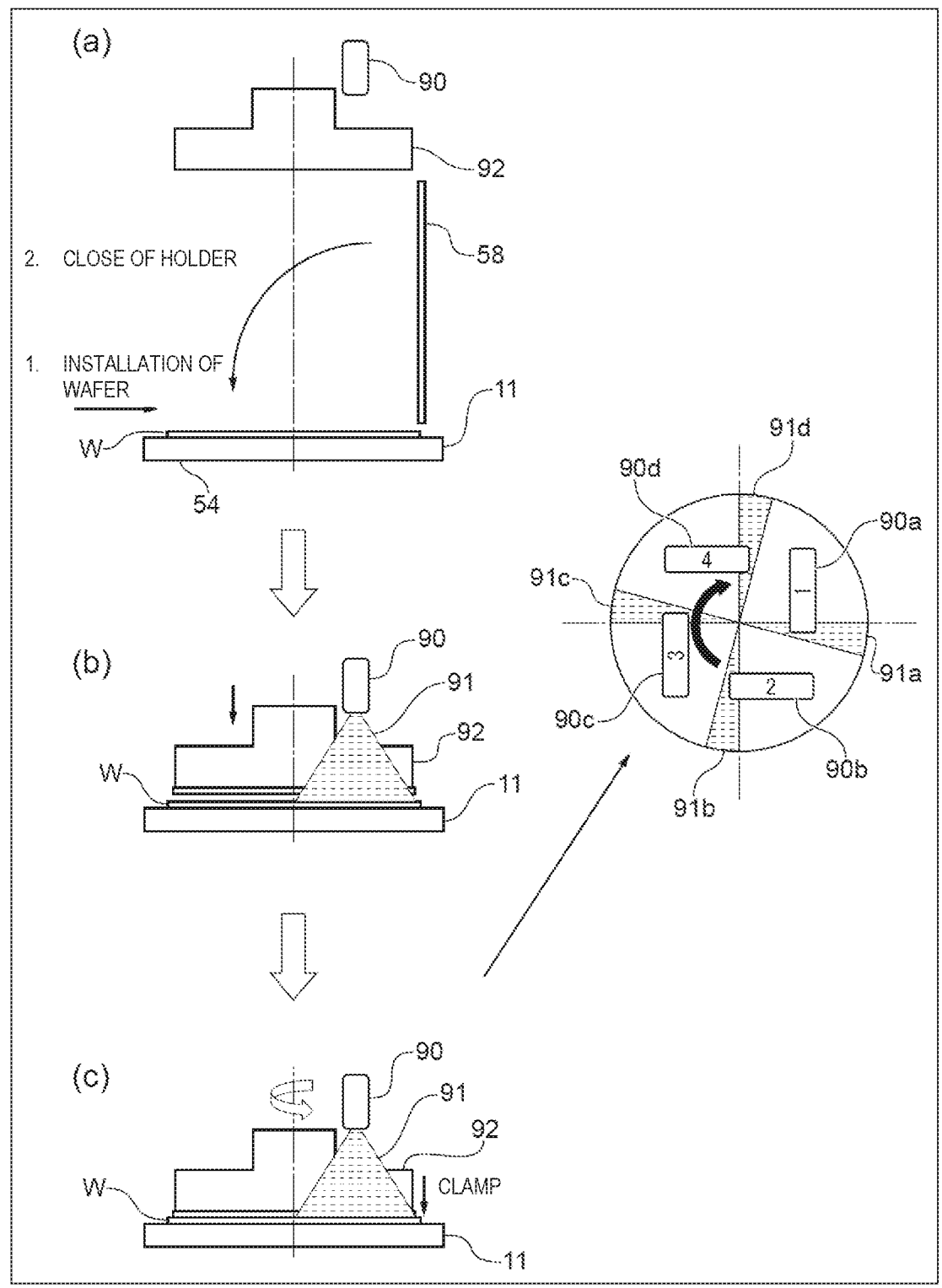
FIG. 10 is an explanatory view showing the measurement of the plating film thickness in a substrate attachment/detachment section.

FIG. 10 is an explanatory view showing the measurement of the plating film thickness at the substrate attachment/detachment section. As shown in FIG. 10(a), when the substrate W is placed on the fixed holding member 54, and the movable holding member 58 is closed while the substrate holder 11 installed in the substrate attachment/detachment section 120 is open, a pressing member 92 and the length measurement sensor 90 move closer to the substrate holder 11 as shown in FIG. 10(b). The pressing member 92 comes into contact with the movable holding member 58 of the substrate holder 11 (FIG. 10(b)) and further presses the movable holding member 58 in such a direction that the substrate holder 11 is closed. The substrate W is thus clamped and locked by the substrate holder 11 (FIG. 10(c)).

According to the present embodiment, prior to the plate processing, the measurement by the length measurement sensor 90 is carried out in the state where the substrate W is not locked by the substrate holder 11 (FIG. 10(b)). After the plate processing, the measurement by the length measurement sensor 90 is carried out in the state where the substrate W is locked by the substrate holder 11 (FIG. 10(c)). The length measurement sensor 90 comprises a plurality of length measurement sensors 90.

According to the present example, there are provided four length measurement sensors 90. For sake of simplicity, the length measurement sensors will be referred to also as length measurement sensors 90a, 90b, 90c and 90d. The layout of the length measurement sensors 90a, 90b, 90c and 90d is shown in a top view of the substrate W on the right-hand side of FIG. 10. The length measurement sensors 90a to 90d are allocated to four regions obtained by dividing the 360-degree rotation of the substrate W into four at a rotation angle of 90 degrees. According to the present example, the substrate holder 11 is rotated by a rotation mechanism, not shown, and each 90-degree angle region of the substrate W is measured by the length measurement sensors 90a to 90d. The length measurement sensors 90a to 90d emit belt-shaped laser beams 91 (91a, 91b, 91c and 91d) onto the substrate W, and receive reflected lights that are diffusely reflected on the surface of the substrate W to profile the surface shape of the substrate W (determine the height distribution), as with FIG. 7. FIG. 10 shows fan-shaped regions (regions divided by dashed lines) on which the belt-like laser lights 91 (91a, 91b, 91c and 91d) are irradiated at a predetermined rotational angle. Instead of rotating the substrate holder 11, it is possible to rotate the length measurement sensors 90a, 90b, 90c and 90d in the circumferential direction of the substrate W by using the rotation mechanism, not shown. The present example refers to the case in which the four length measurement sensors are provided. However, it is also possible to provide less or more than four length measurement sensors. In the case where the plurality of length measurement sensors are provided, if an angle resulted by dividing 360 degrees by the number of the length measurement sensors is set as a measurement region of each of the length measurement sensors, the measurement range becomes uniform, thus leading to improvement in efficiency.

According to the above-described configuration, after the substrate W is clamped by the substrate holder 11 at the substrate attachment/detachment section 120, the profile of the surface shape of the substrate W is created by the length measurement sensors 90a to 90d before or after the clamping, which enables the in-line profile measurement. Since the substrate holder 11 or the length measurement sensors 90a, 90b, 90c and 90d are rotated, the profile of the entire surface of the substrate W can be measured.

Although the example shown in FIG. 10 includes more than one length measurement sensor, it is also possible to provide a single length measurement sensor 90 and rotate the substrate holder 11 or the length measurement sensor 90 at 360 degrees. In the specification, the entire surface of the substrate W is measured by the length measurement sensors. However, it is also possible to measure the film thickness by using the length measurement sensor with respect to a partial region (for example, a fan-shaped region corresponding to a rotation angle of less than 360 degrees) like a fan-shaped portion shown by dashed lines in a plan view on the right-hand side of FIG. 10, and approximate a result of the film thickness measurement of the partial region as a film thickness profile of the whole substrate W. It is also possible to carry out the film thickness measurement with respect to a plurality of fan-shaped portions and approximate results of the film thickness measurement of the portions as a film thickness profile of the whole substrate W. For example, it is possible to measure the film thickness of fan-shaped portions each corresponding to a center angle smaller than 90 degrees by using the length measurement sensors 90a to 90d of FIG. 10, and approximate results of the film thickness measurement of the fan-shaped portions as film thickness profiles of the respective 90-degree angle regions. It is also possible to carry out the film thickness measurement of the fan-shaped portions each corresponding to a center angle smaller than 90 degrees by using the length measurement sensors 90a to 90d, and approximate an average of measurement results of four fan-shaped portions as a profile of the whole substrate W.

Figure 11:
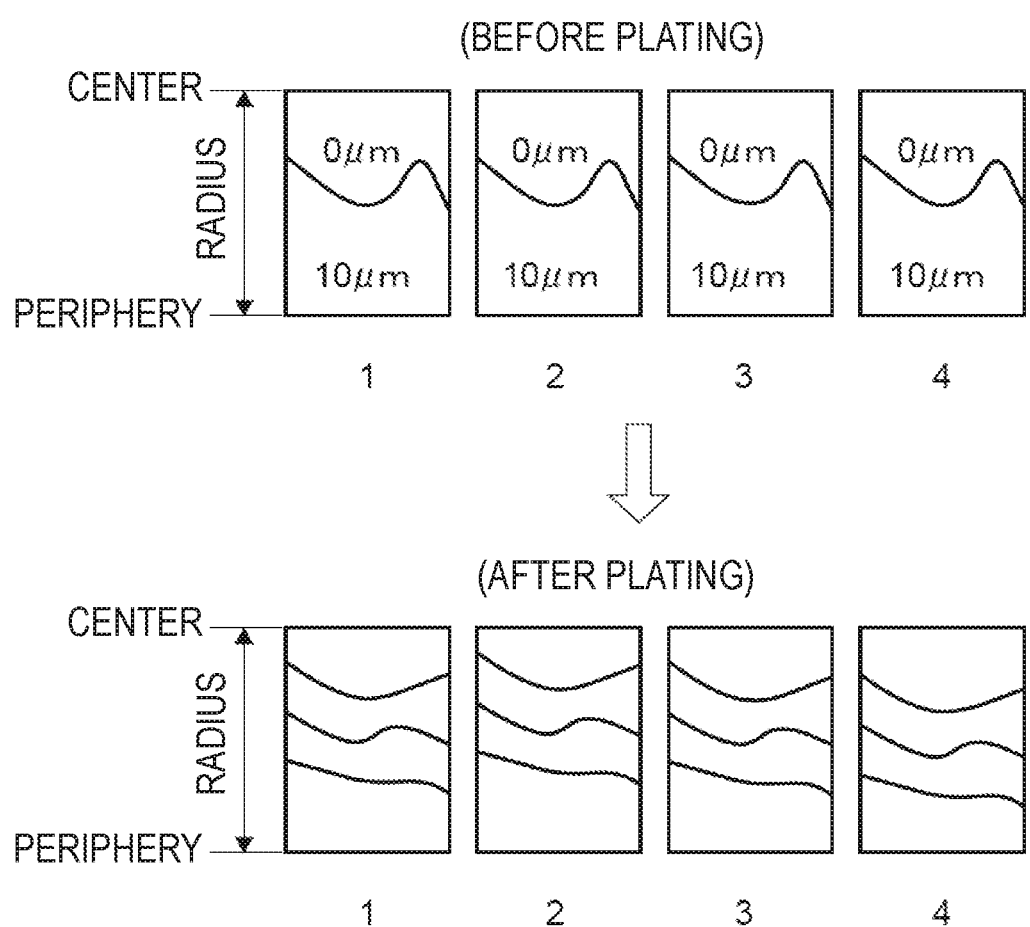
FIG. 11 is a graph showing a result of preplating film thickness measurement and a result of post-plating film thickness measurement in a case where the plating film thickness is measured in the substrate attachment/detachment section.

FIG. 11 is a graph showing a result of preplating film thickness measurement and a result of post-plating film thickness measurement in a case where the plating film thickness is measured at the substrate attachment/detachment section. FIG. 11 is a similar graph to FIG. 8. However, FIG. 11 includes four graphs corresponding to regions of a rotation angle measured by the length measurement sensors 90a, 90b, 90c and 90d. A horizontal axis of each graph represents rotational positions corresponding to one-fourth rotation of the substrate W in accordance with positions in which the length measurement sensors 90a to 90d are installed.

(Height Measurement Procedure 1)

Figure 12:
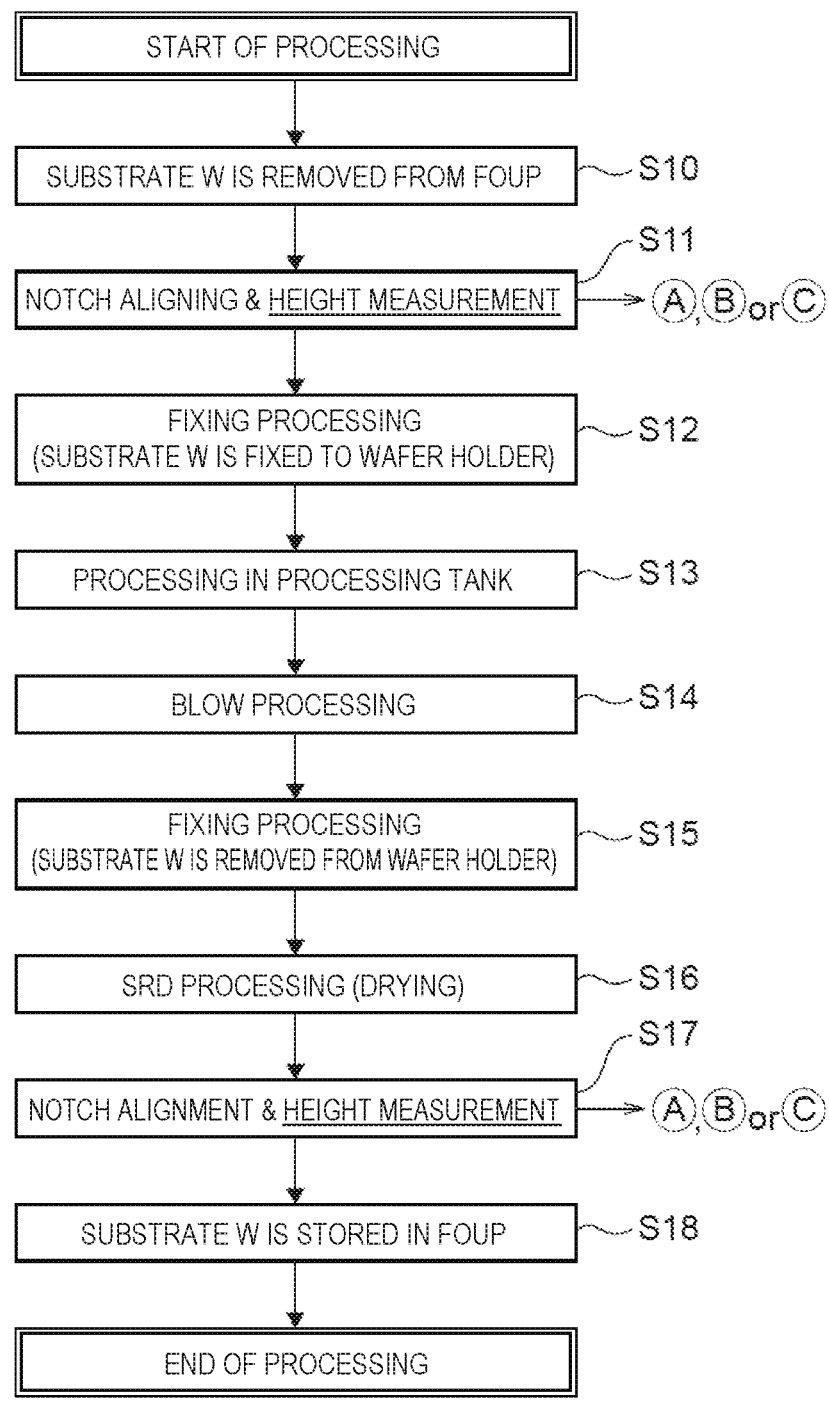
FIG. 12 is a processing flowchart of plating film thickness measurement in the aligner.

FIG. 12 is a processing flowchart of height measurement in a case wherein the plating film thickness is measured by the aligner.

In a Step S10, the substrate W is removed from a cassette (FOUP) 100 by the substrate transfer device 122 and placed on the stage 104b of the aligner 104.

In a Step S11, the aligning of the notch is carried out, and the stage 104b is rotated. At the same time, the profile (height distribution) of the surface of the substrate W is measured by the length measurement sensor 90. Thereafter, the processing of a Step S12 and the subsequent steps is carried out concurrently with a film thickness correction that will be described below with reference to FIGS. 14 to 16.

In the Step S12, the substrate W is placed on the substrate attachment/detachment section 120 by the substrate transfer device 122. The substrate W is clamped and locked by the substrate holder 11 (Fixing processing).

In a Step S13, the processing in each of the processing tanks is carried out.

In a Step S14, blow processing is carried out to dry the substrate W that has been plated.

In a Step S15, the substrate holder 11 holding the substrate W is returned to the substrate attachment/detachment section 120. The substrate holder 11 is then opened, and the substrate W is removed.

In a Step S16, the substrate W is dried in the spin rinse dryer (SRD) 106.

In a Step S17, the substrate W is returned to the aligner 104. As with the Step S11, the aligning of the notch is carried out, and the stage 104b is rotated. At the same time, the profile (distribution of the plating film thickness) of the surface of the substrate W is measured by the length measurement sensor 90. Thereafter, the processing of a Step S18 and the subsequent steps is carried out concurrently with the film thickness correction that will be described below with reference to FIGS. 14 to 16.

In a Step S18, the substrate W is stored in the cassette (FOUP) 100, and the plate processing to the substrate W is then finished.

(Height Measurement Procedure 2)

Figure 13:
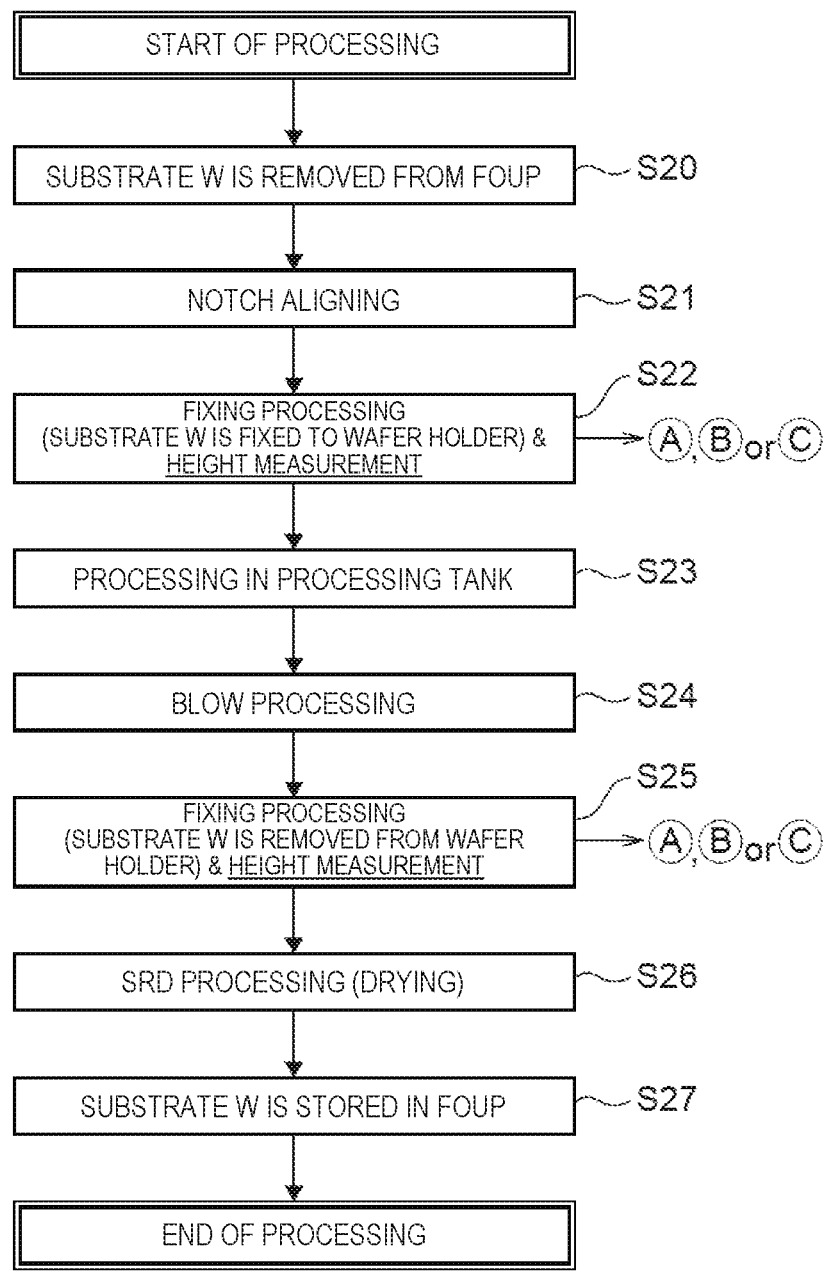
FIG. 13 shows a flowchart of the plating film thickness measurement in the substrate attachment/detachment section.

FIG. 13 shows a flowchart of the plating film thickness measurement at the substrate attachment/detachment section.

In a Step S20, the substrate W is removed from the cassette (FOUP) 100 by the substrate transfer device 122 and placed on the stage 104b of the aligner 104.

In a Step S21, the aligning of the notch is carried out.

In a Step S22, the substrate W is placed on the substrate holder 11 by the substrate transfer device 122, the substrate holder 11 being placed on the substrate attachment/detachment section (fixing station) 120. The substrate W is thus held by the substrate holder 11 (FIG. 10(*b*)). In this state, while the substrate holder 11 or the length measurement sensors 90a to 90d are rotated, the profile (height distribution) of the surface of the substrate W is measured by the length measurement sensors 90a to 90d. After the measurement, the substrate holder 11 is pressed by the pressing member 92 until the projections 72a of the ferrule 72 of the substrate holder 11 slide into the inwardly protruding portions 84a of the clamper 84. The pressing operation by the pressing member 92 is then eased, and the substrate W is clamped and locked by the substrate holder 11. Thereafter, the processing of a Step S23 and the subsequent steps is carried out concurrently with the film thickness correction that will be described below with reference to FIGS. 14 to 16.

In the Step S23, the above-described processing in each of the processing tanks is carried out.

In a Step S24, blow processing is carried out to dry the substrate W that has been plated.

In a Step S25, the substrate holder 11 holding the plated substrate W is returned to the substrate attachment/detachment section 120. While the substrate holder 11 or the length measurement sensors 90a to 90d are rotated with the substrate W locked by the substrate holder 11 (before the clamping is released), the profile (distribution of plating film thickness) of the surface of the substrate W is measured by the length measurement sensors 90a to 90d. The substrate holder 11 is then opened, and the substrate W is removed. Thereafter, the processing of a Step S26 and the subsequent steps is carried out concurrently with the film thickness correction that will be described below with reference to FIGS. 14 to 16.

In a Step S26, the substrate W is dried in the spin rinse dryer (SRD) 106.

In a Step S27, the substrate W is stored in the cassette (FOUP) 100, and the plate processing is finished.

(Film Thickness Correction Procedure 1)

Figure 14:
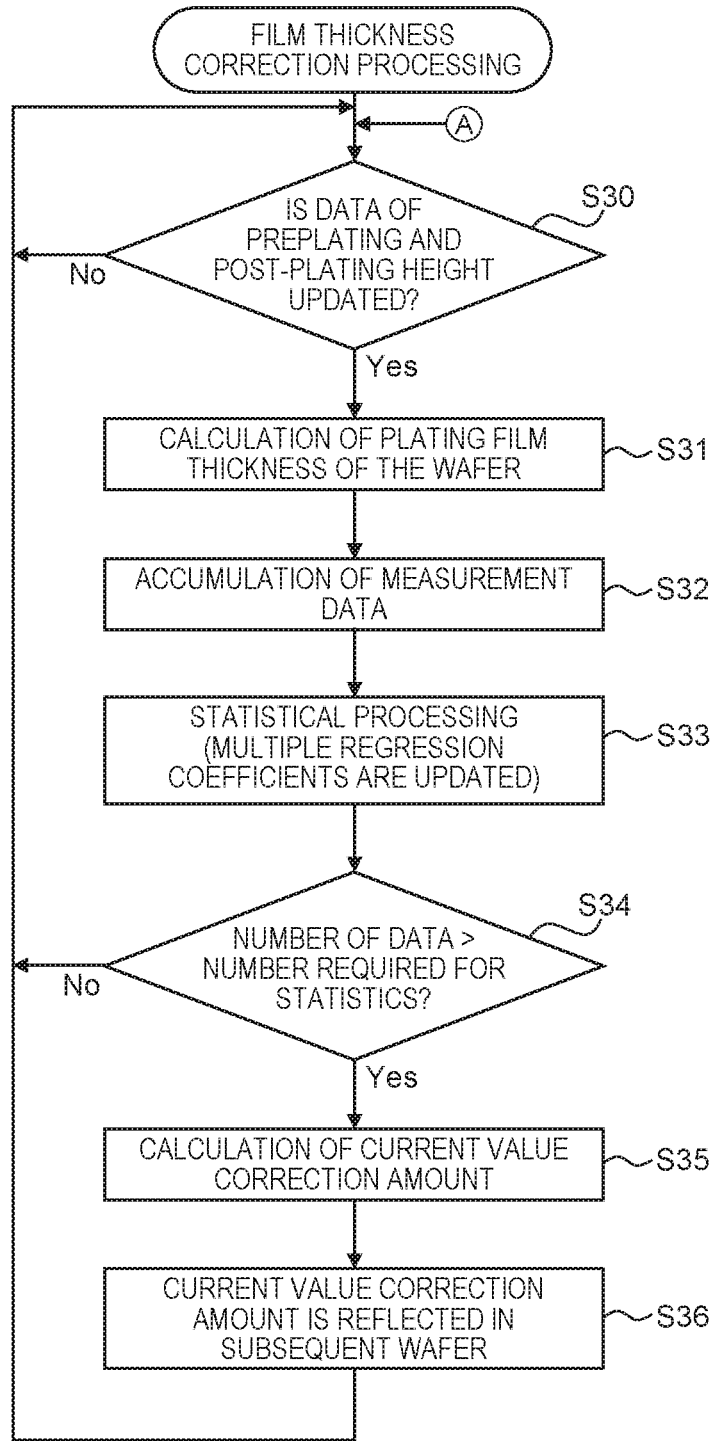
FIG. 14 is a flowchart of film thickness correction in a case where plating current is corrected.

FIG. 14 is a flowchart of film thickness correction which is made by correcting the plating current.

In a Step S30, a judgment is made as to whether data of preplating and post-plating height (film thickness) is updated. The judgment is made on the basis of whether the process feedback controller 304 of the computer 300 shown in FIG. 5 receives the actual measured value data of the film thickness (actual plating film thickness) from the film thickness measurer 500 (length measurement sensor 90). If the data is updated, the procedure advances to a Step S31. If the data is not updated, the Step S30 is repeated until the data is updated.

In a Step S31, difference between preplating and postplating measurement results (average value or distance from an upper surface of the resist) is calculated on the basis of the (Method 1) and (Method 2) discussed above, to thereby calculate the plating film thickness of the substrate W.

In a Step S32, the measurement data of the plating film thickness is accumulated. More specifically, the measurement data of the actual plating film thickness is accumulated as well as the plating current, the plating time, and the target plating film thickness, with respect to each plating cell 50.

In a Step S33, after-mentioned statistical processing is carried out, and multiple regression coefficients are updated.

In a Step S34, a judgment is made as to whether the number of the data exceeds a number required for statistics. The number required for statistics is previously set, by an experiment or the like, to a value that allows an effective correction of plating conditions (plating current and/or plating time) and enables the plating conditions to be corrected with proper timing.

In a Step S35, a correction amount of the plating current (plating current after correction) is calculated by after-mentioned calculation.

In a Step S36, the plating current correction amount (plating current after correction) is reflected to the subsequent substrates W, and the procedure returns to the Step S30.

(Film Thickness Correction Procedure 2)

Figure 15:
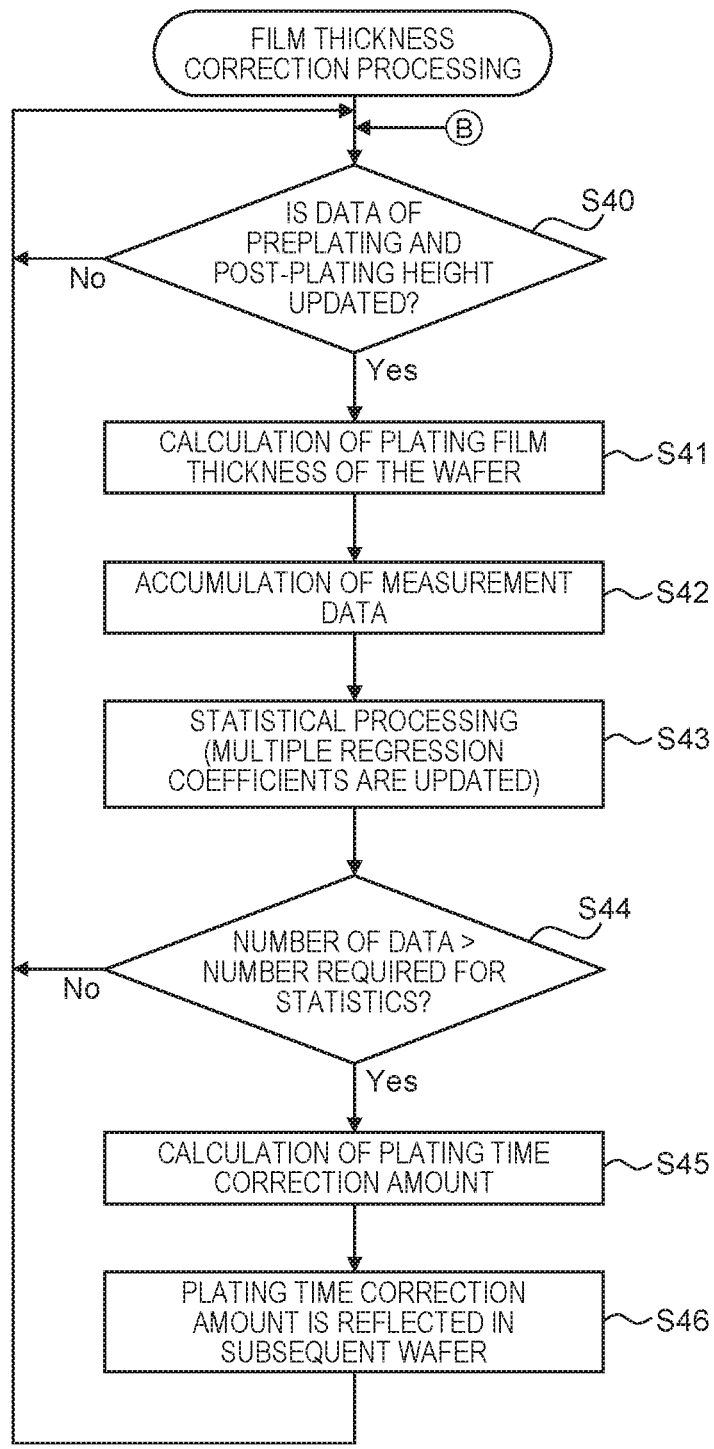
FIG. 15 is a flowchart of film thickness correction in a case where plating time is corrected.

FIG. 15 is a flowchart of film thickness correction which is made by correcting the plating time.

Processing of Steps S40 to S44 is similar to that of Steps S30 to S34 shown in FIG. 14, so that an explanation thereof will be omitted.

In a Step S45, a correction amount of the plating time (plating time after correction) is calculated by an after-mentioned calculation.

In a Step S46, the plating time correction amount (plating time after correction) is reflected to the subsequent substrates W, and the procedure returns to the Step S40.

(Film Thickness Correction Procedure 3)

Figure 16:
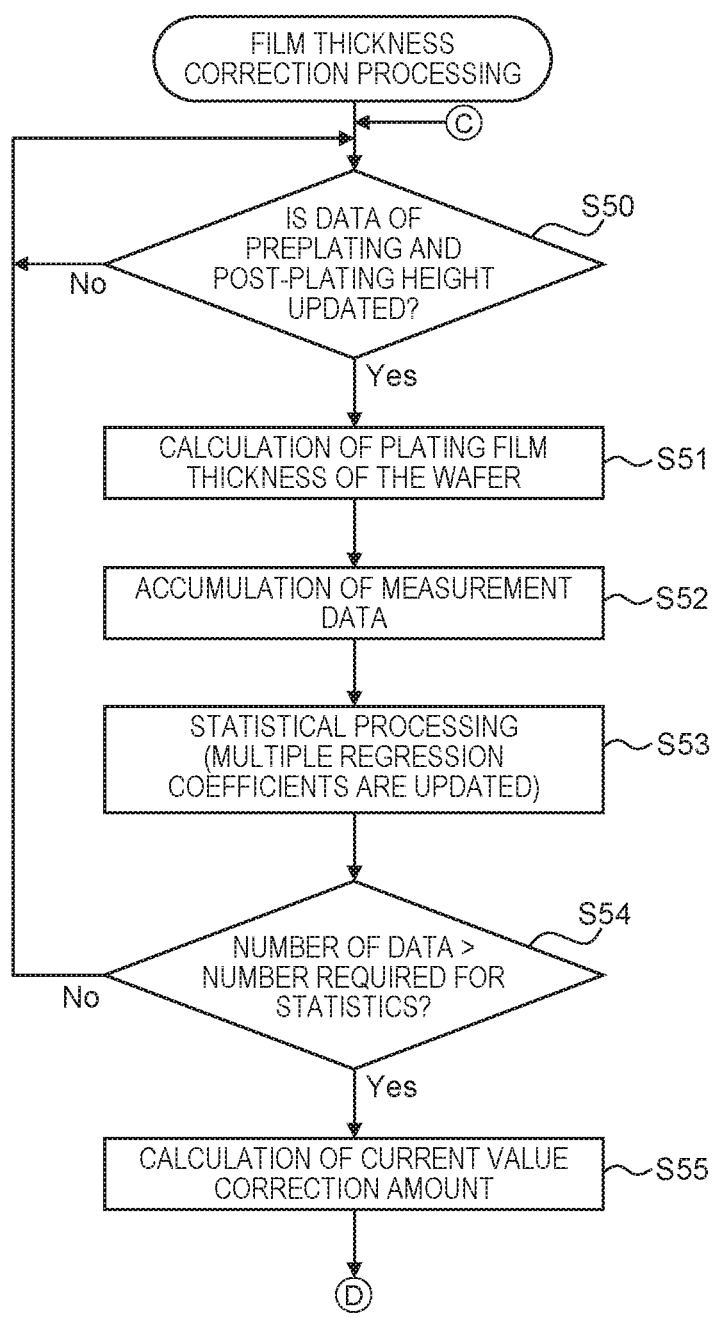
FIG. 16 is a flowchart of film thickness correction in a case where the plating current and the plating time are corrected.
Figure 17:
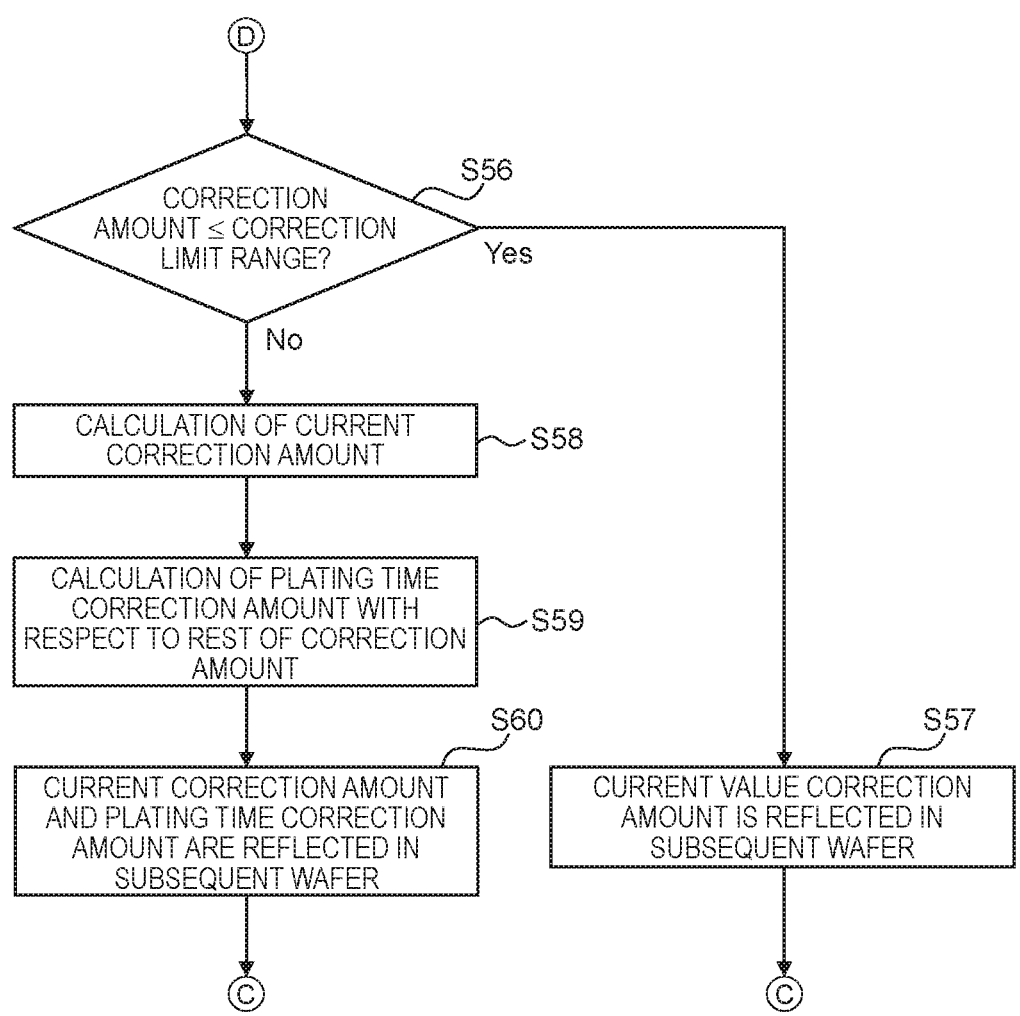
FIG. 17 is a flowchart of film thickness correction in a case where the plating current and the plating time are corrected.

FIGS. 16 and 17 are flowcharts of the film thickness correction which is made by correcting the plating current and the plating time.

Processing of Steps S50 to S54 is similar to that of the Steps S30 to S34 shown in FIG. 14, so that an explanation thereof will be omitted.

In a Step S55, the plating current correction amount is calculated by an after-mentioned calculation.

In a Step S56, a judgment is made as to whether the plating current correction amount that has been calculated is within a correction limit range (whether the plating current correction amount satisfies an expression: a lower limit of the correction amount≤plating current correction amount≤an upper limit of the correction amount). If the plating current correction amount is within the correction limit range, the procedure moves to a Step S57. If the plating current correction amount is not within the correction limit range, the procedure moves to a Step S58. As mentioned later, whether the plating current correction amount is within the limit range may be judged by whether a correction coefficient α is within a predetermined limit range.

In a Step S57, the plating current correction amount calculated in the Step S55 is reflected to the subsequent substrates W (the correction amount is added to a present plating current set value). The procedure then returns to the Step S50.

In a Step S58, the plating current correction amount is limited to values within the correction limit range. For example, if the plating current correction amount is smaller than the lower limit of the correction amount, the plating current correction amount is corrected and set to the lower limit of the correction amount. If the plating current correction amount is larger than the upper limit of the correction amount, the plating current correction amount is corrected and set to the upper limit of the correction amount. In this manner, the plating current correction amount (plating current after correction) is recalculated.

In a Step S59, film thickness difference corresponding to difference between the current correction amount calculated in the Step S55 and the current correction amount corrected in the Step S58 (rest of the current correction amount) is calculated as plating time correction amount (plating time after correction). In other words, the processing carried out in this step use the plating time correction amount to correct the rest of the measured film thickness difference (error between the target plating film thickness and the actual plating film thickness), which cannot be corrected by the plating current correction amount.

In a Step S60, the plating current correction amount and the plating time correction amount which have been calculated in the Steps S58 and S59 are set as plating current and time for the plate processing of the subsequent substrates W. The procedure then returns to the Step S50.

(Calculation of Plating Current and Time Correction)

The description below refers to calculation of the plating current correction amount which is carried out in the Step S35 of FIG. 14 and in the Step S55 of FIG. 16.

[1] Derivation of Correlation of a Recipe Set Value and Plating Film Thickness (1-1) Relational Expression of the Recipe Set Value, the Plating Film Thickness, Etc.

In general, the plating film thickness in Cu electrolytic plating is calculated by the following expression. Copper plating will be explained below as an example, using a Cu theoretical precipitation amount of 0.22. If the value "0.22" is replaced with theoretical precipitation amount γ of plating material in the following explanation, a similar relational expression is true for any plating material.

$$T = 0.22it \quad \text{[Expression 7]}$$

$$i = \frac{I}{\rho A} \quad \text{[Expression 8]}$$

$$T = \frac{0.22}{\rho A} It \quad \text{[Expression 9]}$$

where T is plating film thickness [μm]; 0.22 is theoretical precipitation amount of Cu [μm/AM×dm$^2$]; i is plating current density [A/dm$^2$]; t is current-carrying time (plating time) [min]; I is plating current [A]; ρ is aperture ratio; and A is substrate area [dm$^2$]. A is more precisely the area of the substrate, which is exposed from the substrate holder 11.

If each of the above values is a theoretical value, the following expression is also true.

$$T_T = \frac{0.22}{\rho A} I_T t_T \qquad \text{[Expression 10]}$$

where $T_T$ is theoretical plating film thickness [μm]; $I_T$ is theoretical plating current [A]; and $t_T$ is theoretical plating time [min].

If a single substrate is to be plated by a plurality of steps while a plating current value is varied, the plating film thickness T is expressed by the following expression.

$$T = \sum_n 0.22 \frac{I_n}{\rho A} t_n \qquad \text{[Expression 11]}$$

where $I_n$ is plating current [A] of a step n, and $t_n$ is plating time [min] of the step n. n is a positive number (positive integer).

Considering the target plating film thickness and the target plating current density with respect to each step, the plating current value and the plating time, which are required in each step, can be calculated by the following expression.

$$I_n = \rho A i_n, \qquad \text{[Expression 12]}$$
$$t_n = \frac{T_n}{0.22 i_n}$$

where $i_n$ is target plating current density [A/dm²] of the step n, and $T_n$ is target plating film thickness [μm] of the step n.

(1-2) Description about an Error Associated with the Current Set Value and an Output Value If the actual plating current output value that is outputted from a current output device of the plating system 1 has error with respect to set (theoretical) current, the following expression is true.

$$I_R = b I_T = c \qquad \text{[Expression 13]}$$

where $I_R$ is actual measured plating current [A]; $I_T$ is theoretical plating current [A]; and b and c are coefficients.

The actual plating film thickness $T_R$ with respect to an output value of the actual plating current $I_R$ can be expressed by an Expression 14. An Expression 15 is therefore derived from the Expressions 13 and 14.

$$T_R = \frac{0.22}{\rho A} I_R t_T \qquad \text{[Expression 14]}$$

$$T_R = \frac{0.22}{\rho A} (b I_T + c) t_T \qquad \text{[Expression 15]}$$

where $T_R$ is actual measured plating film thickness (actual plating film thickness) [μm], and $t_T$ is the current-carrying time (theoretical plating time) [min] corresponding to theoretical plating film thickness.

If an Expression 16 is assigned to the Expression 15, an Expression 17 is obtained.

$$T_T = \frac{0.22}{\rho A} I_T t_T \qquad \text{[Expression 16]}$$

$$T_R = b T_T + c \frac{0.22}{\rho A} t_T \qquad \text{[Expression 17]}$$

If error between the theoretical film thickness and the actual film thickness, which is caused by other factors is offset a, an Expression 18 is derived as below.

$$T_R = a + b T_T + c \frac{0.22}{\rho A} t_T \qquad \text{[Expression 18]}$$

where $T_R$ is the actual plating film thickness [μm]; $T_T$ is the theoretical plating film thickness [μm]; $t_T$ is the current-carrying time for obtaining the theoretical plating film thickness (theoretical plating time) [min]; and a, b and c are multiple regression coefficients.

(1-3) Application of Multiple Regression Coefficients

It can be considered from the Expression 18 that the actual plating film thickness is generally correlated to the theoretical plating film thickness and the current-carrying time (plating time) in view of a multiple regression analysis.

The coefficients a, b and c are obtained as target plating film thickness $T_{Tm}$, total current-carrying time (total plating time) $t_{Tm}$, and actual plating film thickness $T_{Rm}$ in the plate processing of m-th plating cell from a set of $\{T_{T1}, t_{T1}, T_{R1}, T_{T2}, t_{T2}, T_{R2}, \ldots, T_{Tm}, t_{Tm}, T_{Rm}\}$ by the multiple regression analysis using Bayes' statistics.

If the plating is performed in the plurality of steps while the plating current value is varied, the following expression is derived from the Expression 18.

$$T_R = a + b \sum_n \frac{0.22}{\rho A} I_{Tn} t_{Tn} + c \frac{0.22}{\rho A} t_T \qquad \text{[Expression 19]}$$

where $I_{Tn}$ is the target plating current [A] of the step n, and $t_{Tn}$ is theoretical current-carrying time (theoretical plating time) [min] corresponding to the target plating film thickness of the step n.

[2] Case in which the Plating Current Value is Corrected (2-1) Calculation of a Correction Plating Current Value (Case in which Correction Amounts Δ are Maintained Common and Constant Between the Steps)

$$T_T = a + b \sum_n \frac{0.22}{\rho A} I_{sn} t_{sn} + c \frac{0.22}{\rho A} t_s \qquad \text{[Expression 20]}$$

where $T_T$ is the theoretical plating film thickness calculated from the recipe set value; $I_{sn}$ is the plating current value that is set by the recipe in the step n; $t_{sn}$ is the current-carrying time (plating time) that is set by the recipe of the step n; and $t_s$ is the total current-carrying time (total plating time) that is set by the recipe.

If the target plating film thickness $T_T$ is obtained by adding ΔI to the current value $I_s$ set by the recipe, the theoretical plating current value thereof is $I_T$ as below.

$$I_T = I_s + \Delta I \qquad \text{[Expression 21]}$$

An Expression 22 is true with respect to each step.

$$I_{Tn} = I_{sn} + \Delta I_n \quad \text{[Expression 22]}$$

If $\Delta I_n$ is common between all the steps, the following expression is true: $I_{Tn} = I_{sn} + \Delta I$, $I_{sn} = I_{Tn} - \Delta I$, where $\Delta I_n = \Delta I$. Therefore, the following expression is derived from the Expression 20.

$$T_T = a + b \sum_n \frac{0.22}{\rho A}(I_{Tn} - \Delta I)t_{sn} + c\frac{0.22}{\rho A}t_s \quad \text{[Expression 23]}$$
$$= a + \frac{0.22b}{\rho A}\sum_n I_{Tn}t_{sn} - \frac{0.22b}{\rho A}\sum_n \Delta I t_{sn} + c\frac{0.22}{\rho A}t_s$$

From the above expression, it can be considered as below.

$$t_{sn} = t_{Tn}, \; \frac{0.22}{\rho A}\sum_n I_{Tn}t_{Tn} = T_T \quad \text{[Expression 24]}$$

Therefore, the current correction amount $\Delta I$ is calculated as below.

$$T_T = a + bT_T - \frac{0.22bt_s}{\rho A}\Delta I + \frac{0.22ct_s}{\rho A} \quad \text{[Expression 25]}$$

$$\Delta I = \frac{\rho A}{0.22bt_s}\{a + (b-1)T_T\} + \frac{c}{b} \quad \text{[Expression 26]}$$

The following is an explanation of parameters. $\rho$ is the aperture ratio; A is the substrate area; $\Delta I$ is the plating current correction amount; $T_T$ is the theoretical plating film thickness (target plating film thickness) calculated from the recipe set value; $t_s$ is the total current-carrying time that is set by the recipe (total plating time that is set by the recipe); and a, b and c are the multiple regression coefficients. $t_s$ of the Expression 26 and $t_T$ of the Expression 18 are the same.

If the multiple regression coefficients a, b and c are obtained from the Bayes' statistics, the plating current correction amount $\Delta I$ can be calculated from the above coefficients, the target plating film thickness $T_T$, and the total plating time $t_s$ set by the recipe.

(2-2) Calculation of a Corrected Current Value (when a Ratio of a Current Correction Value to Set Current is Constant)

$$\Delta I_n = \alpha I_{sn} \quad \text{[Expression 27]}$$

where $\alpha$ is a plating current correction coefficient when the ratio of the plating current correction amount to the set current is constant.

The following expression is derived from the Expressions 27 and 22.

$$I_{Tn} = I_{sn} + \alpha I_{sn}, \; I_{Tn} = (1+\alpha)I_{sn}, \; I_{sn} = \{1/(1+\alpha)\} \times I_{Tn}$$

If this is assigned to $I_{sn}$ of the Expression 20, the following expression is true.

$$T_T = a + b\sum_n \frac{0.22}{\rho A}\left(\frac{1}{1+\alpha}\right)I_{Tn}t_{sn} + c\frac{0.22}{\rho A}t_s \quad \text{[Expression 28]}$$

With the Expression 24, the following expression is true.

$$T_T = a + \frac{bT_T}{1+\alpha} + \frac{0.22ct_s}{\rho A} \quad \text{[Expression 29]}$$

Therefore, the current correction coefficient $\alpha$ is obtained as below.

$$\alpha = \frac{\rho A b T_T}{\rho A (T_T - a) - 0.22 c t_s} - 1 \quad \text{[Expression 30]}$$

The following is an explanation of parameters. $\rho$ is the aperture ratio; A is the substrate area; $T_T$ is the theoretical plating film thickness (target plating film thickness) calculated from the recipe set value; $t_s$ is the total current-carrying time (total plating time) that is set by the recipe; and a, b and c are the multiple regression coefficients.

If the multiple regression coefficients a, b and c are obtained from the Bayes' statistics, the plating current correction coefficient $\alpha$ can be calculated from the above coefficients, the target plating film thickness $T_T$, and the total plating time $t_s$ set by the recipe. The plating current correction amount $\Delta I$ in the step n can be calculated from $\Delta I_n = \alpha I_{sn}$. If the result is added to the plating current $I_{sn}$, the corrected plating current $I_{sn} + \Delta I_n$ in the step n can be calculated. If the corrected plating current is calculated from $(1+\alpha)I_{sn}$, the same result can be obtained.

[3] Case in which the Plating Time is Corrected

The correction of the plating time, which is carried out in the Step S45 of FIG. 15, will be explained below.

(3-1) Calculation of Corrected Plating Time (when a Ratio of the Corrected Plating Time to the Set Plating Time is Constant)

If the target plating film thickness $T_T$ is obtained by adding $\Delta t$ to the total current-carrying time (plating time) is which is set by the recipe, the theoretical current-carrying time (theoretical plating time) thereof is $t_T$ as below.

$$t_T = t_s + \Delta t \quad \text{[Expression 31]}$$

In each of the steps, the following expression is true.

$$t_{Tn} = t_{sn} + \Delta t_n \quad \text{[Expression 32]}$$

If a ratio of the plating time correction amount $\Delta t_n$ to the set plating time $t_{sn}$ is constant, the following expression is true.

$$\Delta t_n = \beta t_{sn} \quad \text{[Expression 33]}$$

where $\beta$ is the plating time correction coefficient.
Therefore, the following expression is true.

$$t_{Tn} = t_{sn} + \beta t_{sn}, \; t_{Tn} = (1+\beta)t_{sn}, \; t_{sn} = t_{Tn}/(1+\beta)$$

If this is assigned to the Expression 20, the following expression is true.

$$T_T = a + b\sum_n \frac{0.22}{\rho A}I_{sn}\left(\frac{1}{1+\beta}\right)t_{Tn} + c\frac{0.22}{\rho A}t_s \quad \text{[Expression 34]}$$

From the above expression, it can be considered as below.

$$I_{sn} = I_{Tn}, \; \frac{0.22}{\rho A}\sum_n I_{Tn}t_{Tn} = T_T \quad \text{[Expression 35]}$$

Therefore, the following expression can be derived.

$$T_T = a + \frac{bT_T}{1+\beta} + \frac{0.22ct_s}{\rho A} \qquad \text{[Expression 36]}$$

The time correction coefficient $\beta$ can be calculated as below.

$$\beta = \frac{\rho A b T_T}{\rho A(T_r - a) - 0.22ct_s} - 1 \qquad \text{[Expression 37]}$$

The following is an explanation of parameters. $\rho$ is the aperture ratio; A is the substrate area; $T_T$ is the theoretical plating film thickness (target plating film thickness) calculated from the recipe set value; $t_s$ is the total current-carrying time (total plating time) that is set by the recipe; and a, b and c are the multiple regression coefficients.

If the multiple regression coefficients a, b and c are obtained from the Bayes' statistics, the plating current correction coefficient $\beta$ can be calculated from the above coefficients a, b and c, the target plating film thickness $T_T$, and the total plating time $t_s$ set by the recipe. Therefore, the following expressions are true.

The time correction amount $\Delta t_n = \beta t_{sn}$, the corrected plating time $t_{Tn} = t_{sn} + \Delta t_n$ If the corrected plating time is calculated from $(1+\beta)t_{sn}$, the same result can be obtained.

[4] Case in which Both the Plating Current and Time are Corrected

The correction of the plating current and time, which is made in the Steps S55, S56, S58 and S59 of FIG. 16 will be discussed below.

(4-1) Current Correction Amount Limit

If the plating current density is out of a certain range, the quality of the plating film usually might be adversely affected. For that reason, in a case where a limit range is provided with respect to the plating current density, if the plating current correction amount exceeds the correction limit range (upper limit/lower limit) thereof, the plating current correction amount is suppressed within the limit range, and the rest of the correction amount is assigned to the time correction amount.

An Expression 38 below needs to be fulfilled.

$$i_{min} < i_{Tn} < i_{max} \qquad \text{[Expression 38]}$$

where $i_{Tn}$ is a set value [A/dm²] of plating current density of the step n; $i_{min}$ is a lower limit [A/dm²] of the correction amount of the plating current density; $i_{max}$ is an upper limit [A/dm²] of the correction amount of the plating current density.

The following expression is derived from the Expressions 22 and 27.

$$I_{Tn} = (\alpha+1)I_{sn}, \quad I = \rho A i$$

Therefore, $$i_{Tn} = (\alpha+1)i_{sn} \qquad \text{[Expression 39]}$$

The set range of the plating current correction coefficient $\alpha$ can be expressed as below from the Expressions 38 and 39.

$$\frac{i_{min}}{i_{sn}} - 1 < \alpha < \frac{i_{max}}{i_{sn}} - 1 \qquad \text{[Expression 40]}$$

(4-2) Calculation of the Corrected Plating Current

If the plating current correction coefficient $\alpha$ calculated from the Expression 30 does not fulfill the Expression 40, the following expression is derived from the Expression 27.

$$\Delta I_n = \alpha_{lim} I_{sn} \qquad \text{[Expression 41]}$$

where $\alpha$ lim ($\alpha_{min}$ or $\alpha_{max}$) is the upper or lower limit of $\alpha$. In addition, the following expression is true.

The upper limit $\alpha_{max} = i_{max}/i_{sn} - 1$, the lower limit $\alpha_{min} = i_{min}/i_{sn} - 1$ The plating current correction amount in the step n is a result obtained by multiplying the upper limit $\alpha_{max}$ or lower limit $\alpha_{min}$ of the correction coefficient $\alpha$ by the plating current value $I_{sn}$ that is set by the recipe in the step n. If the result is assigned to the Expression 22, $I_{Tn} = I_{sn} + \Delta I_n$, the corrected plating current in the step n is calculated.

(4-3) Calculation of the Corrected Plating Time

The rest of the film thickness correction amount for the film thickness to be corrected according to the plating current correction amount in the measured film thickness difference is assigned to the plating time correction amount. The following expression is derived from the Expression 29.

$$\rho A(1+\alpha)T_T = \rho A(1+\alpha)a + \rho A b T_T + 0.22ct_s(1+\alpha) \qquad \text{[Expression 42]}$$

$$\{\rho A(1+\alpha) - \rho A b\}T_T = (\rho A a + 0.22ct_s)(1+\alpha) \qquad \text{[Expression 43]}$$

$$T_T = \frac{(\rho A a + 0.22ct_s)(1+\alpha)}{\rho A(1+\alpha) - \rho A b} \qquad \text{[Expression 44]}$$

The following expression is derived from the Expression 44.

$$T_{T\_lim} = \frac{(\rho A a + 0.22ct_s)(1+\alpha_{lim})}{\rho A(1+\alpha_{lim}) - \rho A b} \qquad \text{[Expression 45]}$$

where $\alpha_{lim}$ is a limit value of a plating current limit range; $T_{T\_lim}$ is plating film thickness that is calculated from $\alpha_{lim}$; and $\Delta T = T_T - T_{T\_lim}$ is the film thickness correction by correcting the plating time.

$$\Delta T = T_T - T_{T\_lim} = (\rho A a + 0.22ct_s) \qquad \text{[Expression 46]}$$
$$\left\{ \frac{1+\alpha}{\rho A(1+\alpha) - \rho A b} - \frac{1+\alpha_{lim}}{\rho A(1+\alpha_{lim})\rho A b} \right\}$$

where $\alpha$ is a correction coefficient before limitation is set; and $\alpha_{lim}$ is the upper limit $\alpha_{max}$ or the lower limit $\alpha_{min}$.

The coefficient $\beta$ of the time correction amount is expressed as below if $T_T$ of the Expression 37 is replaced with $\Delta T$.

$$\beta = \frac{\rho A b \Delta T}{\rho A(\Delta T - a) - 0.22ct_s} - 1 \qquad \text{[Expression 47]}$$

The following is an explanation of parameters. $\rho$ is the aperture ratio; A is the substrate area; $\Delta T$ is the film thickness correction by correcting the plating time; $t_s$ is the total plating time that is set by the recipe; and a, b and c are the multiple regression coefficients.

In other words, if the multiple regression coefficients a, b and c are obtained from the statistical processing, the plating time correction coefficient β can be calculated from the above coefficients, the film thickness correction ΔT by correcting the plating time (Expression 46), and the total plating time $t_s$ that is set by the recipe. The plating time correction amount in the step n can be calculated from the Expression 33, $\Delta t_n = \beta \times t_{sn}$. If this is assigned to the Expression 32, $t_{Tn} = t_{sn} + \Delta t_n$, the corrected plating time can be calculated. The same result can be obtained if the corrected plating time $t_{Tn}$ is calculated from $(1+\beta)t_{sn}$.

From the above-described embodiments, at least following technical ideas (embodiments) can be recognized.

[1] A plating system according to one aspect of the present invention comprises a plating tank for applying plate processing to a substrate, a sensor configured to measure actual plating film thickness of the substrate, and a controller configured to control plating current and plating time for the plate processing of the substrate within the plating tank. The controller is capable of setting target plating film thickness, plating current, and plating time as a plate processing recipe. In accordance with the actual plating film thickness and the target plating film thickness, at least one of the plating current and the plating time is automatically corrected so that the actual plating film thickness and the target plating film thickness become equal to each other, and at least one of the corrected plating current and the corrected plating time is reflected in the plate processing for the subsequent substrate.

Since the plating system includes the sensor configured to measure the actual plating film thickness of the substrate after the plate processing, it is possible to directly check if the actual plating film thickness is equal to the target plating film thickness. It is also possible to measure the actual plating film thickness with proper timing without having to wait for all the substrates in the same carrier (cassette) to be processed. This allows at least one of the plating current and the plating time to be corrected to a proper value with proper timing in response to temporal changes of the plating system, a substrate holder, and the other consumables. The sensor being disposed within the plating system also enables in-line measurement of the plating film thickness and allows the measurement of the plating film thickness and the correction of the plating current and/or the plating time without degradation of throughput.

The plating current and/or plating time that are/is corrected in accordance with a measured value(s) associated with the plate processing of one or more substrates can be reflected in the plate processing of the subsequent substrates. The plating system properly sets the number of substrates about which measured value data are acquired for one correction. This makes it possible to achieve both accurate and quick correction of the plating current and/or the plating time by accumulation of measurement data.

[2] According to the plating system described in [1], the controller corrects the plating current without correcting the plating time when plating current density corresponding to the corrected plating current is between first current density and second current density, inclusive. When the plating current density is lower than the first current density or higher than the second current density, the controller corrects the plating current to correct first film thickness difference of measured film thickness difference between the target plating film thickness and the actual plating film thickness, and corrects the plating time to correct second film thickness difference that is difference between the measured film thickness difference and the first film thickness difference.

In general, if the plating current density is out of a certain range, such a plating current density can affect the quality of the plating film adversely. However, if the measured film thickness difference is corrected by separately correcting the first film thickness difference and the second film thickness difference by the correction of the plating current and the plating time, the plating current density can be limited within a predetermined plating current limit range (between the first current density and the second current density, inclusive), which prevents or reduces the possibility of an adverse effect on the quality of the plating film. As compared to a case in which the measured film thickness difference is corrected only by correcting the plating time, it is possible to prevent or reduce effects on the processing that is carried out by the other processing units of the plating system, and also prevent or reduce effects on the throughput.

[3] According to the plating system described in [2], the first film thickness difference is a film thickness correction amount that is corrected by the first or second current density of the plating current density. The second film thickness difference is difference between the film thickness correction amount corrected by the first or second current density and the measured film thickness difference.

The plating current density is corrected to reach the first or second current density which are limit values of the plating current limit range, and the rest of the correction is assigned to the correction of the plating time. This makes it possible to prevent or reduce the increase of the plating time, the effects on the processing carried out by the other processing units of the plating system, and the degradation of the throughput.

[4] According to the plating system described in [3], the controller calculates a correction amount of the plating current in accordance with the actual plating film thickness. When the correction amount of the plating current is equal to or higher than a first current correction amount corresponding to the first current density and equal to or lower than a second current correction amount corresponding to the second current density, the controller calculates the corrected plating current from the calculated correction amount of the plating current. When the correction amount of the plating current is lower than the first current correction amount or higher than the second current correction amount, the controller sets the correction amount of the plating current to the first current correction amount or the second current correction amount, and calculates the correction amount of the plating time to further correct the difference between the film thickness correction amount corresponding to the first or second current correction amount and the measured film thickness difference.

In the above case, since the correction of the plating current is prioritized, the effects on the throughput can be prevented or reduced as much as possible. If the plating current density exceeds the limit range, the correction amount of the plating current is set to a maximum correction amount (first or second current correction amount), and the rest of the correction is assigned to the correction of the plating time. This allows the current density to be properly maintained while the effects on the throughput is prevented or reduced as much as possible. Furthermore, the range of correction amount of the plating current is limited correspondingly to the current density limit range, so that the calculation associated with the correction of the plating current can be properly and effectively made.

[5] According to the plating system described in [1], the controller corrects the plating current without correcting the plating time.

In the above case, the actual plating film thickness can be adjusted to be equal to the target plating film thickness through relatively simple control by correcting the plating current in accordance with the measured value of the sensor. In this case, since the plating time is not corrected, the effects on the throughput can be prevented or reduced.

[6] According to the plating system described in [1], the controller corrects the plating time without correcting the plating current.

In the above case, the actual plating film thickness can be adjusted to be equal to the target plating film thickness through relatively simple control by correcting the plating time in accordance with the measured value of the sensor. In this case, since the plating current is not corrected, the plating current density is prevented from exceeding the limit range to effect the quality of the plating film.

[7] According to the plating system described in any one of [1] to [6], the controller is configured to be set so that the plate processing is carried out on the substrate in a plurality of steps, have or obtain the plating current and the plating time, which are set with respect to each step, as the recipe, and correct the plating current and/or the plating time in each step.

When the plate processing is carried out in the plurality of steps, the plating current and/or plating time in each step can be properly corrected.

[8] According to the plating system described in any one of [1] to [7], when the plating current is corrected, the plating current is corrected by adding the correction amount to the plating current, and the correction amount of the plating current is a result of multiplying the plating current by a coefficient that is a constant value.

In this case, the correction amount can be calculated while reflecting a magnitude of present plating current.

[9] According to the plating system described in any one of [1] to [7], when the plating time is corrected, the plating time is corrected by adding the correction amount to the plating time. The correction amount of the plating time is a result of multiplying the plating time by a coefficient that is a constant value.

In this case, the correction amount can be calculated while reflecting a magnitude of present plating time.

[10] According to the plating system described in [7], when the plating current is corrected, the correction amount of the plating current is corrected by adding the correction amount to a value of the plating current. The correction amount is set to a value common to the steps.

In this case, since the correction amount common to the steps is calculated, the correction amount of the plating current can be easily calculated.

[11] According to the plating system described in any one of [1] to [10], the controller applies statistical processing to the actual plating film thickness, the target plating film thickness, and theoretical plating time for obtaining the target plating film thickness, in the plurality of substrates. When the number of data acquired by the statistical processing exceeds a predetermined value, the controller corrects at least one of the plating current and the plating time by using the data acquired by the statistical processing. The statistical processing is carried out, for example, by using Bayes' statistics to update a multiple regression coefficient.

In this case, the correction amount of the plating current and/or the plating time can be accurately calculated in accordance with the predetermined number of the statistical processing data. The predetermined number is preset by an experiment according to the plating system, the kinds of the substrates, plating material, and the like to secure accuracy in correction of the plating current and/or the plating time.

[12] According to the plating system described in [10], the controller is further capable of setting an aperture ratio that is a result of dividing actual plating area by area of the substrate, or the actual plating area, as a preset recipe item.

By using the following Expressions 1 and 2, $$T_R = a + bT_T + c\frac{\gamma}{\rho A}t_T \qquad \text{[Expression 1]}$$

$$\Delta I = \frac{\rho A}{\gamma b t_s}\{a + (b-1)T_T\} + \frac{c}{b} \qquad \text{[Expression 2]}$$

where $T_R$ is the actual plating film thickness [μm]; $T_T$ is the target plating film thickness [μm]; $t_T$ is the theoretical plating time [min] for obtaining target plating film thickness; $\rho$ is the aperture ratio; A is the substrate area; $\gamma$ is theoretical deposition amount of the plating material; ts is total plating time which is determined by recipe setting; and a, b, c are multiple regression coefficients, the controller calculates the multiple regression coefficients a, b and c by multiple regression analysis from the measured values of the actual plating film thickness $T_R$ after the plate processing in the plurality of substrates and the Expression 1, calculates correction amount $\Delta I$ of the plating current from the calculated multiple regression coefficients a, b and c and the Expression 2, and calculates the corrected plating current by adding the correction amount $\Delta I$ to the plating current determined by the recipe setting of each of the plurality of steps.

[13] According to the plating system described in [8], the controller is further capable of setting the aperture ratio that is a result of dividing the actual plating area by the substrate area, or the actual plating area, as a preset recipe item.

By using the following Expressions 3 and 4, $$T_R = a + bT_T + c\frac{\gamma}{\rho A}t_T \qquad \text{[Expression 3]}$$

$$\alpha = \frac{\rho A b T_T}{\rho A(T_T - a) - \gamma c t_s} - 1 \qquad \text{[Expression 4]}$$

where $T_R$ is the actual plating film thickness [μm]; $T_T$ is the target plating film thickness [μm]; $t_T$ is the theoretical plating time [min] for obtaining target plating film thickness; $\rho$ is the aperture ratio; A is the substrate area; $\gamma$ is theoretical deposition amount of the plating material; ts is total plating time which is determined by recipe setting; and a, b, c are multiple regression coefficients, the controller calculates the multiple regression coefficients a, b and c by multiple regression analysis from the measured values of the actual plating film thickness $T_R$ after the plate processing in the plurality of substrate and the Expression 3, calculates a correction coefficient $\alpha$ for the plating current from the calculated multiple regression coefficients a, b and c and the Expression 4, and calculate the corrected plating current by multiplying $(1+\alpha)$ to the plating current determined by the recipe setting of each of the plurality of steps.

[14] According to the plating system described in [9], the controller is further capable of setting the aperture ratio that is a result of dividing the actual plating area by the substrate area, or the actual plating area, as a preset recipe item.

By using the following Expressions 5 and 6, $$T_R = a + bT_T + c\frac{\gamma}{\rho A}t_T \quad \text{[Expression 5]}$$

$$\beta = \frac{\rho AbT_T}{\rho A(T_T - a) - \gamma ct_S} - 1 \quad \text{[Expression 6]}$$

where $T_R$ is the actual plating film thickness [µm]; $T_T$ is the target plating film thickness [µm]; $t_T$ is the theoretical plating time [min] for obtaining target plating film thickness; ρ is the aperture ratio; A is the substrate area; γ is theoretical deposition amount of the plating material; ts is total plating time which is determined by recipe setting; and a, b, c are multiple regression coefficients, the controller calculates the multiple regression coefficients a, b and c by multiple regression analysis from the measured values of the actual plating film thickness $T_R$ and the Expression 5, calculates correction coefficient β of the plating time from the calculated multiple regression coefficients a, b and c and the Expression 6, and calculate the corrected plating time by multiplying (1+β) to the plating time determined by the recipe setting of each of the plurality of steps.

[15] According to the plating system described in any one of [1] to [14], the plating tank includes a plurality of plating cells. A measured result of the actual film thickness is managed with respect of each plating cell. At least one of the plating current and the plating time is corrected with respect to each plating cell in accordance with the actual plating film thickness of the substrates subjected to the plate processing in the plating cells.

In this case, the plating current and/or the plating time can be corrected corresponding to characteristic variation of each plating cell and temporal changes of each plating cell.

[16] According to the plating system described in any one of [1] to [15], there is further provided an aligner configured to align the substrate. The sensor is disposed in the aligner.

In this case, while the aligner measures alignment of the substrates, profiles of surfaces of the substrates (height distribution) can be measured by the sensor. In-line measurement of profiles of the substrate surfaces (height distribution) therefore can be performed.

[17] The plating system described in any one of [1] to [15], there is provided a substrate attachment/detachment section for attaching the substrate to a substrate holder. The sensor is disposed in the substrate attachment/detachment section.

In this case, when the substrate is held by the substrate holder in the substrate attachment/detachment section (fixing Station), the profiles of the substrate surfaces (height distribution) can be measured by the sensor. The in-line measurement of profiles of the substrate surfaces (height distribution) therefore can be performed. For example, prior to the plate processing, the profile of the substrate surface can be measured before the substrate is clamped (locked) to the substrate holder. After the plate processing, the profile of the substrate surface can be measured with the substrate clamped (locked) to the substrate holder.

[18] A method for controlling a plating system according to one aspect of the invention, the plating system comprising a plating tank for applying plate processing to a substrate, a sensor configured to measure actual plating film thickness of the substrate, and a controller configured to control plating current and plating time for the plate processing of the substrate within the plating tank. The method includes the step in which target plating film thickness, plating current, and plating time are set as a plate processing recipe. The method further includes the step in which in accordance with the actual plating film thickness and the target plating film thickness, at least one of the plating current and the plating time is automatically corrected so that the actual plating film thickness and the target plating film thickness become equal to each other, and at least one of the corrected plating current and the corrected plating time is reflected in the plate processing for the subsequent substrate.

According to the plating system control method, since the actual plating film thickness is measured by the sensor disposed in the plating system, it is possible to directly check if the actual plating film thickness is equal to the target plating film thickness. It is also possible to measure the actual plating film thickness with proper timing without having to wait for all the substrates in the same carrier (cassette) to be processed. This allows at least one of the plating current and the plating time to be corrected to a proper value with proper timing in response to temporal changes of the plating system, and the like. The sensor disposed within the plating system is used, which enables in-line measurement of the plating film thickness and allows the measurement of the plating film thickness and the correction of the plating current and/or the plating time without degradation of throughput.

The plating current and/or plating time that are/is corrected in accordance with a measured value(s) associated with the plate processing of one or more substrates can be reflected in the plate processing of the subsequent substrates. The plating system properly sets the number of substrates about which measured value data are acquired for one correction. This makes it possible to achieve both accurate and quick correction of the plating current and/or the plating time by accumulation of measurement data.

[19] A storage medium according to one aspect of the invention is a storage medium containing a program for causing a computer to execute a method for controlling the plating system, the plating system comprising a plating tank for applying plate processing to a substrate, a sensor configured to measure actual plating film thickness of the substrate, and a controller configured to control plating current and plating time for the plate processing of the substrate within the plating tank. The program executes the steps of: setting target plating film thickness, plating current, and plating time as a plate processing recipe; and automatically correcting at least one of the plating current and the plating time in accordance with the actual plating film thickness and the target plating film thickness so that the actual plating film thickness and the target plating film thickness become equal to each other, and reflecting at least one of the corrected plating current and the corrected plating time in the plate processing for the subsequent substrate.

According to the storage medium, since the actual plating film thickness is measured by the sensor disposed within the plating system, it is possible to directly check if the actual plating film thickness is equal to the target plating film thickness. It is also possible to measure the actual plating film thickness with proper timing without having to wait for all the substrates in the same carrier (cassette) to be processed. This allows at least one of the plating current and the plating time to be corrected to a proper value with proper timing in response to temporal changes of the plating system, and the like. The sensor disposed within the plating system is used, which enables in-line measurement of the plating film thickness and allows the measurement of the plating film thickness and the correction of the plating current and/or the plating time without degradation of throughput.

The plating current and/or plating time that are/is corrected in accordance with a measured value(s) associated with the plate processing of one or more substrates can be reflected in the plate processing of the subsequent substrates. If the number of substrates about which the data of measured values is acquired for one correction is properly set, it is possible to achieve both accurate and quick correction of the plating current and/or the plating time, which is accomplished by accumulation of measurement data.

The embodiments of the present invention have been explained with the description of a few examples. These embodiments are intended to facilitate the understanding of the invention and do not limit the embodiments. The invention may be modified or improved without deviating from the gist thereof, and equivalents thereof are included in the present invention. As far as at least part of the foregoing problem can be solved or at least some of the advantages can be provided, the constituent elements mentioned in the claims or description may be arbitrarily combined or omitted.

The present application claims priority to Japanese Patent Applications No. 2016-155710 filed on Aug. 8, 2016. The entire disclosure of No. 2016-155710 filed on Aug. 8, 2016 including specification, claims, drawings and summary is incorporated herein by reference in its entirety.

The entire disclosure of Japanese Unexamined Patent Application Publication No. 2002-105695 (Patent Document 1), Japanese Unexamined Patent Application Publication No. 2003-013297 (Patent Document 2), Japanese Unexamined Patent Application Publication No. 2003-183892 (Patent Document 3), Japanese Unexamined Patent Application Publication No. 2003-321792 (Patent Document 4), Japanese Unexamined Patent Application Publication No. 2005-121616 (Patent Document 5), Japanese Unexamined Patent Application Publication No. 2005-240108 (Patent Document 6), Japanese Unexamined Patent Application Publication No. 2008-013851 (Patent Document 7), Japanese Unexamined Patent Application Publication No. 2011-064590 (Patent Document 8), and Japanese Unexamined Patent Application Publication No. 2006-319348 (Patent Document 9), including specification, claims, drawings and summary is incorporated herein by reference in its entirety.

REFERENCE MARKS

1: plating system
10: plating tank
11: substrate holder
18: paddle
19: paddle driving device
50: plating cell
54: first holding member (fixed holding member)
56: hinge
58: second holding member (movable holding member)
60: base
62: seal ring holder
62a: stepped portion
64: substrate seal line
66: substrate seal member
66a: projecting part
66b: downwardly protruding portion
68: holder seal member
68a: downwardly protruding portion
68a: downwardly protruding portion
70: fixed ring
72: ferrule
72a: projection
74: spacer
80: support base
80a: protrusion
82: movable base
82a: support face
82b: recess
84: clamper
84a: inwardly protruding portion
86: compression spring
88: thickness absorption mechanism
90 (90a to 90d): displacement and length measurement sensor
91 (91a to 91d): belt-shaped laser beam
92: pressing member
100: cassette
102: cassette table
104: aligner
104a: aligner body
104b: stage
106: spin rinse dryer
120: substrate attachment/detachment section
122: substrate transfer device
124: stocker
126: prewet tank
128: presoak tank
130a: first washing tank
130b: second washing tank
132: blow tank
140: substrate holder transfer device
142: first transporter
144: second transporter
150: rail
152: placement plate
170A: load/unload unit
170B: plate processing unit
300: system computer
300A: memory
300B: CPU
300C: controller
301: operation screen controller
302: substrate processing information monitor
303: substrate transfer controller
304: process feedback controller
400: system control controller
500: film thickness measurer

What is claimed is:

1. A non-transitory storage medium containing a program for causing a computer to execute a method for controlling a plating system, the plating system comprising a plating tank for applying plate processing to a substrate, a sensor configured to measure actual plating film thickness of the substrate, and a controller configured to control plating current and plating time for the plate processing of the substrate within the plating tank, the program executing the steps of:

setting target plating film thickness, plating current, and plating time as a plate processing recipe, and automatically correcting at least one of the plating current and the plating time in accordance with the actual plating film thickness and the target plating film thickness so that the actual plating film thickness and the target plating film thickness become equal to each other, and reflecting at least one of the corrected plating current and the corrected plating time in the plate processing for the subsequent substrate, wherein the program corrects the plating current without correcting the plating time when plating current density corresponding to the corrected plating current is between first current density and second current density, inclusive; and wherein when the plating current density is lower than the first current density or higher than the second current density, the program corrects the plating current to correct first film thickness difference of measured film thickness difference between the target plating film thickness and the actual plating film thickness, and corrects the plating time to correct second film thickness difference that is difference between the measured film thickness difference and the first film thickness difference.

2. The non-transitory storage medium according to claim 1, wherein the first film thickness difference is a film thickness correction amount that is corrected by the first current density or the second current density of the plating current density; and wherein the second film thickness difference is difference between the film thickness correction amount corrected by the first current density or the second current density and the measured film thickness difference.

3. The non-transitory storage medium according to claim 2, wherein the program calculates a correction amount of the plating current on the basis of the actual plating film thickness;

wherein when the correction amount of the plating current is equal to or higher than a first current correction amount corresponding to the first current density and equal to or lower than a second current correction amount corresponding to the second current density, the program calculates the corrected plating current from the correction amount of the plating current; and wherein when the correction amount of the plating current is lower than the first current correction amount or higher than the second current correction amount, the program sets the correction amount of the plating current to the first current correction amount or the second current correction amount, and calculates the correction amount of the plating time so as to further correct the difference between the film thickness correction amount corresponding to the first current correction amount or the second current correction amount and the measured film thickness difference.

4. The non-transitory storage medium according to claim 1, wherein the program corrects the plating current without correcting the plating time.

5. The non-transitory storage medium according to claim 1, wherein the program corrects the plating time without correcting the plating current.

6. The non-transitory storage medium according to claim 1, wherein the program applies statistical processing to the actual plating film thickness of the plurality of substrates, the target plating film thickness, and theoretical plating time for obtaining the target plating film thickness; and when the number of data acquired by the statistical processing exceeds a predetermined value, the program corrects at least one of the plating current and the plating time by using the data acquired by the statistical processing.

7. The non-transitory storage medium according to claim 1, wherein the plating tank includes a plurality of plating cells; and wherein the program measures the actual plating film thickness of the substrate subjected to the plate processing in each of the plating cells, and the program corrects at least one of the plating current and the plating time with respect to each of the plating cells in accordance with the actual plating film thickness.

8. The non-transitory storage medium according to claim 1, wherein there is further provided in the plating system an aligner configured to align the substrate; and wherein the sensor is disposed in the aligner.

9. The non-transitory storage medium according to claim 1, wherein there is provided in the plating system a substrate attachment/detachment section for attaching the substrate to a substrate holder;

wherein the sensor is disposed in the substrate attachment/detachment section.

10. A non-transitory storage medium containing a program for causing a computer to execute a method for controlling a plating system, the plating system comprising a plating tank for applying plate processing to a substrate, a sensor configured to measure actual plating film thickness of the substrate, and a controller configured to control plating current and plating time for the plate processing of the substrate within the plating tank, the program executing the steps of:

setting target plating film thickness, plating current, and plating time as a plate processing recipe, and automatically correcting at least one of the plating current and the plating time in accordance with the actual plating film thickness and the target plating film thickness so that the actual plating film thickness and the target plating film thickness become equal to each other, and reflecting at least one of the corrected plating current and the corrected plating time in the plate processing for the subsequent substrate, wherein the program is configured to be set so that the plate processing is carried out on the substrate in a plurality of steps, have or obtain the plating current and the plating time, which are set with respect to each step, as the recipe, and correct the plating current and/or the plating time in each step, wherein when the plating current is corrected, the correction amount of the plating current is corrected by adding the correction amount to a value of the plating current; and the correction amount is set to a value common to the steps, and wherein the program is further capable of setting an aperture ratio that is a fraction obtained by dividing actual plating area by area of the substrate, or the actual plating area, as a preset recipe item; and wherein by using the following Expressions 1 and 2, $$T_R = a + bT_T + c\frac{\gamma}{\rho A}t_T \qquad \text{[Expression 1]}$$

-continued $$\Delta I = \frac{\rho A}{\gamma b t_s}\{a + (b-1)T_T\} + \frac{c}{b}$$ [Expression 2]

where $T_R$ is the actual plating film thickness [μm]; $T_T$ is the target plating film thickness [μm]; $t_T$ is the theoretical plating time [min] for obtaining target plating film thickness; ρ is the aperture ratio; A is the substrate area; γ is theoretical deposition amount of the plating material; ts is total plating time which is determined by recipe setting; and a, b and c are multiple regression coefficients;

the program calculates the multiple regression coefficients a, b and c by multiple regression analysis from the measured values of the actual plating film thickness $T_R$ after the plate processing in the plurality of substrates and the Expression 1, calculates correction amount ΔI of the plating current from the calculated multiple regression coefficients a, b and c and the Expression 2, and calculates the corrected plating current by adding the correction amount ΔI to the plating current determined by the recipe setting of each of the plurality of steps.

11. A non-transitory storage medium containing a program for causing a computer to execute a method for controlling a plating system, the plating system comprising a plating tank for applying plate processing to a substrate, a sensor configured to measure actual plating film thickness of the substrate, and a controller configured to control plating current and plating time for the plate processing of the substrate within the plating tank, the program executing the steps of:

setting target plating film thickness, plating current, and plating time as a plate processing recipe, and automatically correcting at least one of the plating current and the plating time in accordance with the actual plating film thickness and the target plating film thickness so that the actual plating film thickness and the target plating film thickness become equal to each other, and reflecting at least one of the corrected plating current and the corrected plating time in the plate processing for the subsequent substrate, wherein when the plating current is corrected, the plating current is corrected by adding the correction amount to the plating current, and the correction amount of the plating current is a result of multiplying the plating current by a coefficient that is a constant value, and wherein the program is further capable of setting the aperture ratio that is a fraction obtained by dividing the actual plating area by the substrate area, or the actual plating area, as a preset recipe item; and wherein by using the following Expressions 3 and 4, $$T_R = a + bT_T + c\frac{\gamma}{\rho A}t_T$$ [Expression 3]

$$\alpha = \frac{\rho A b T_T}{\rho A(T_T - a) - \gamma c t_S} - 1$$ [Expression 4]

where $T_R$ is the actual plating film thickness [μm]; $T_T$ is the target plating film thickness [μm]; $t_T$ is the theoretical plating time [min] for obtaining target plating film thickness; ρ is the aperture ratio; A is the substrate area; γ is theoretical deposition amount of the plating material; ts is total plating time which is determined by recipe setting; and a, b and c are multiple regression coefficients;

the program calculates the multiple regression coefficients a, b and c by multiple regression analysis from the measured value of the actual plating film thickness $T_R$ after the plate processing in the plurality of substrates and the Expression 3, calculates a correction coefficient α for the plating current from the calculated multiple regression coefficients a, b and c and the Expression 4; and calculates corrected plating current by multiplying the plating current, which is determined by the recipe setting of each of the plurality of steps, by (1+α).

12. A non-transitory storage medium containing a program for causing a computer to execute a method for controlling a plating system, the plating system comprising a plating tank for applying plate processing to a substrate, a sensor configured to measure actual plating film thickness of the substrate, and a controller configured to control plating current and plating time for the plate processing of the substrate within the plating tank, the program executing the steps of:

setting target plating film thickness, plating current, and plating time as a plate processing recipe, and automatically correcting at least one of the plating current and the plating time in accordance with the actual plating film thickness and the target plating film thickness so that the actual plating film thickness and the target plating film thickness become equal to each other, and reflecting at least one of the corrected plating current and the corrected plating time in the plate processing for the subsequent substrate, wherein when the plating time is corrected, the plating time is corrected by adding the correction amount to the plating time; and the correction amount of the plating time is a result of multiplying the plating time by a coefficient that is a constant value, and wherein the program is further capable of setting the aperture ratio that is a fraction obtained by dividing the actual plating area by the substrate area, or the actual plating area, as a preset recipe item; and wherein by using the following Expressions 5 and 6, $$T_R = a + bT_T + c\frac{\gamma}{\rho A}t_T$$ [Expression 5]

$$\beta = \frac{\rho A b T_T}{\rho A(T_T - a) - \gamma c t_s} - 1$$ [Expression 6]

where $T_R$ is the actual plating film thickness [μm]; $T_T$ is the target plating film thickness [μm]; $t_T$ is the theoretical plating time [min] for obtaining target plating film thickness; ρ is the aperture ratio; A is the substrate area, γ is theoretical deposition amount of the plating material; ts is total plating time which is determined by recipe setting; and a, b and c are multiple regression coefficients, the program calculates the multiple regression coefficients a, b and c by multiple regression analysis from the measured values of the actual plating film thickness $T_R$ after the plate processing in the plurality of substrates and the Expression 5, calculates correction coefficient β of the plating time from the calculated multiple regression coefficients a, b and c and the Expression 6, and calculates corrected plating time by multiplying the plating time, which is determined by the recipe setting of each of the plurality of steps, by $(1+\beta)$.

* * * * *